(12) United States Patent
Gosain et al.

(10) Patent No.: US 8,619,208 B2
(45) Date of Patent: Dec. 31, 2013

(54) DISPLAY AND METHOD FOR MANUFACTURING DISPLAY

(75) Inventors: Dharam Pal Gosain, Tokyo (JP);
Tsutomu Tanaka, Kanagawa (JP);
Makoto Takatoku, Kanagawa (JP)

(73) Assignee: Japan Display West Inc., Aichi (JP)

( * ) Notice: Subject to any disclaimer, the term of this patent is extended or adjusted under 35 U.S.C. 154(b) by 471 days.

(21) Appl. No.: 12/530,801

(22) PCT Filed: Sep. 18, 2008

(86) PCT No.: PCT/JP2008/066815
§ 371 (c)(1),
(2), (4) Date: Sep. 11, 2009

(87) PCT Pub. No.: WO2009/038111
PCT Pub. Date: Mar. 26, 2009

(65) Prior Publication Data
US 2010/0171120 A1 Jul. 8, 2010

(30) Foreign Application Priority Data

Sep. 21, 2007 (JP) ................................. 2007-244880
Aug. 26, 2008 (JP) ................................. 2008-216975

(51) Int. Cl.
*G02F 1/136* (2006.01)
*G02F 1/13* (2006.01)

(52) U.S. Cl.
USPC ................................ 349/48; 349/43; 349/187

(58) Field of Classification Search
USPC ............................................. 349/41–48, 187
See application file for complete search history.

(56) References Cited

U.S. PATENT DOCUMENTS

| 7,385,223 | B2 * | 6/2008 | Koo et al. | 257/72 |
| 2003/0122165 | A1 * | 7/2003 | Joo | 257/222 |
| 2005/0017318 | A1 * | 1/2005 | Ishida et al. | 257/444 |
| 2005/0099551 | A1 * | 5/2005 | Yang et al. | 349/43 |
| 2005/0176194 | A1 * | 8/2005 | Sasaki et al. | 438/197 |

FOREIGN PATENT DOCUMENTS

| CN | 1577018 A | 2/2005 |
| JP | 10-090655 | 4/1998 |
| JP | 2005-043672 | 2/2005 |
| JP | 2007-08458 | 1/2007 |

OTHER PUBLICATIONS

International Search Report dated Sep. 21, 2007.
Japanese Office Action dated Jan. 22, 2013, issued in connection with counterpart Japanese Patent Application No. 2008-216975.
Chinese Office Action dated Aug. 30, 2011, issued in connection with counterpart Chinese Patent Application No. 2008-80009062.1.

* cited by examiner

*Primary Examiner* — Bumsuk Won
*Assistant Examiner* — Charles Chang
(74) *Attorney, Agent, or Firm* — Dentons US LLP

(57) ABSTRACT

In the case of forming switching elements and light sensor elements over the same substrate, an increase in the film thickness of active layers in an attempt to enhance the sensitivity of the light sensor elements would adversely affect the characteristics of the switching elements (TFTs). In a configuration of a display in which a channel layer 25 for constituting thin film transistors to form the switching elements for pixels and a photoelectric conversion layer 35 for constituting the light sensor elements are provided over a gate insulating film 24 on a glass substrate 5 to be provided with a plurality of pixels arranged in a matrix pattern, the photoelectric conversion layer 35 is formed to be thicker than the channel layer 25, and/or the photoelectric conversion layer 35 is formed of a material different from the material for the channel layer 25, whereby the light absorption coefficient of the photoelectric conversion layer 35 is made to be higher than that of the channel layer 25.

15 Claims, 34 Drawing Sheets

FIG.34
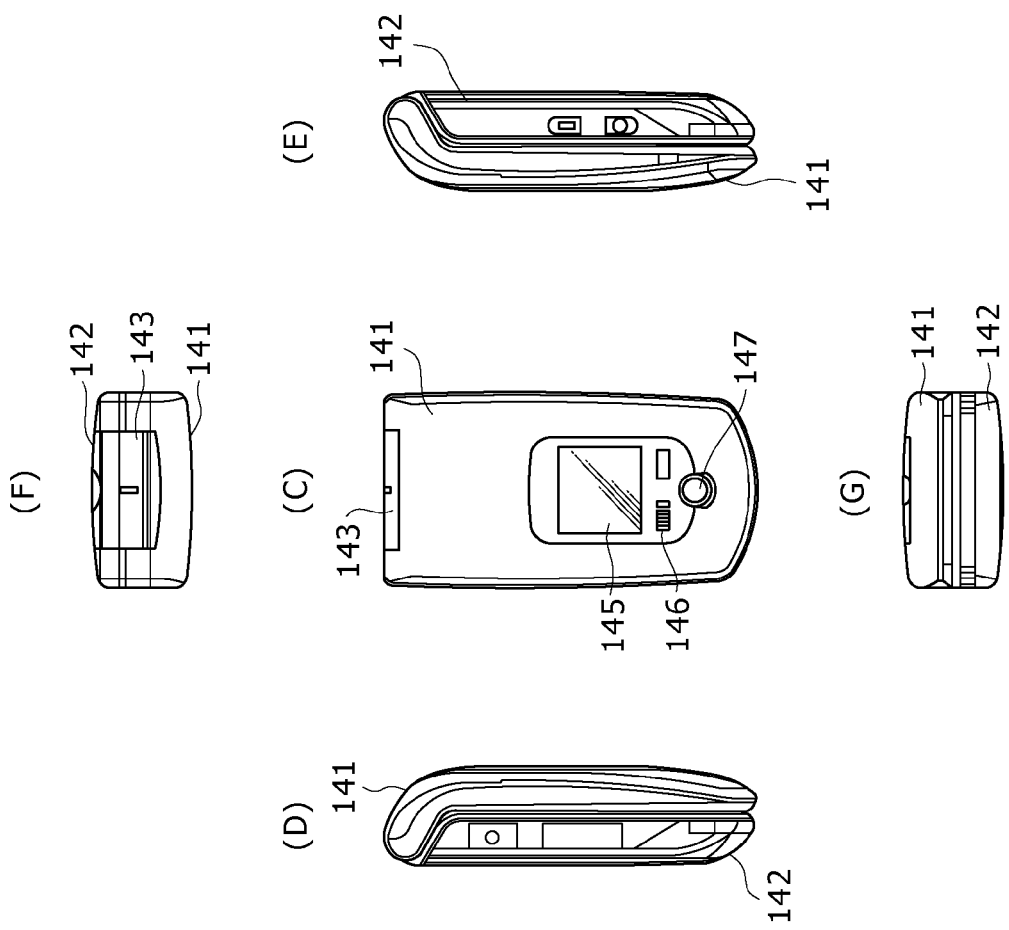
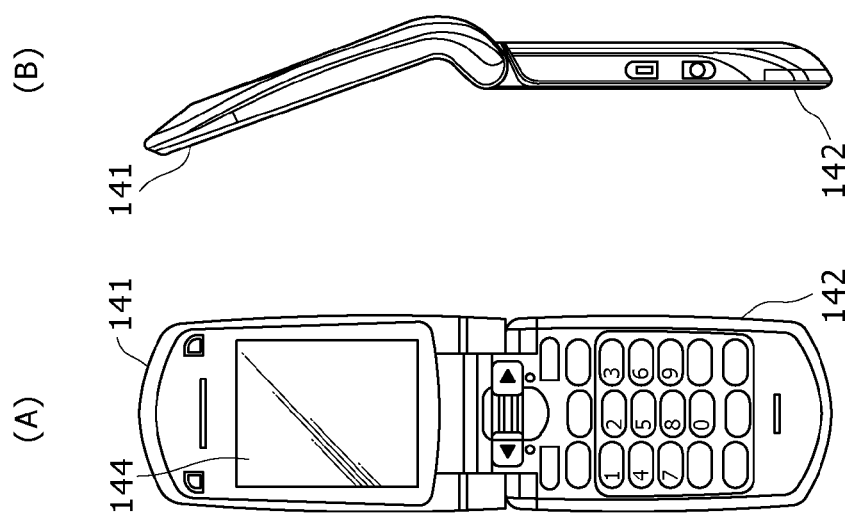

DISPLAY AND METHOD FOR MANUFACTURING DISPLAY

TECHNICAL FIELD

The present invention relates to a display integrally provided with light sensors and a method for manufacturing the same.

BACKGROUND ART

Recently, liquid crystal displays using a-Si:H (hydrogenated amorphous silicon) TFTs or poly-Si (polycrystalline silicon) TFTs are provided with an automatic back-light adjusting function or a touch screen function utilizing light sensors. In this type of liquid crystal displays, light sensor elements are configured with the same structure as that of thin film transistors (TFTs) provided as switching elements for pixels (refer to, for example, Japanese Patent Laid-open No. 2007-018458). Therefore, it is possible to inexpensively provide a display equipped with light sensors, without spoiling such advantageous features as reduced size and reduced thickness.

Hitherto, a layer contributing to photoelectric conversion by sensing light in the light sensor element (the layer will hereinafter be referred to as "photoelectric conversion layer") has been formed in the same step as that for forming a channel layer in the thin film transistor serving as the switching element for the pixel. Therefore, the photoelectric conversion layer in the light sensor elements and the channel layer in the thin film transistors are formed in the same thickness over a substrate.

However, in the liquid crystal displays using the a-Si:H TFTs or poly-Si TFTs, generally, the channel layer is composed of a very thin film in order to maintain good transistor characteristics. In this case, the photoelectric conversion layer is composed of a very thin film, like the channel layer. In the displays equipped with light sensors according to the related art, therefore, most of the light externally incident on the light sensor element would be transmitted through the photoelectric conversion layer, making it very difficult to obtain a sufficient sensor sensitivity.

Besides, the channel layer in a poly-Si TFTs is generally formed in a thickness of 50 nm to 100 nm. If the photoelectric conversion layer is formed in a film thickness similar to that of the channel layer, for example, a thickness of around 50 nm, visible light is mostly transmitted through the film portion of the photoelectric conversion layer, irrespectively of whether the film portion is formed of poly-Si or a-Si. The light thus transmitted does not contribute to generation of electron-hole pairs and, therefore, the sensitivity of the light sensor element is lowered.

FIG. 35 is a graph plotted with light wavelength ($\lambda$) taken on the axis of abscissas, absorption coefficient ($\alpha$) taken on the left axis of ordinates, and film thickness at which light intensity becomes 1/e taken on the right axis of ordinates, in the case where poly-Si is used to form the channel layer and the photoelectric conversion layer. Similarly, FIG. 36 is a graph plotted with light wavelength ($\lambda$) taken on the axis of abscissas, absorption coefficient ($\alpha$) taken on the left axis of ordinates, and film thickness at which light intensity becomes 1/e taken on the right axis of ordinates, in the case where a-Si:H is used to form the channel layer and the photoelectric conversion layer.

As is seen from FIGS. 35 and 36, a film thickness of at least 100 nm and above may be needed to ensure good light absorption. To enhance the sensitivity of the light sensor, it may be contemplated to increase the film thickness at the parts corresponding to the channel layer and the photoelectric conversion layer. In the case of the poly-Si TFT, however, an increase in the film thickness leads to problems such as a rise in the OFF current of transistor, an increase in light leakage, and a difficulty in crystallization by a laser annealing treatment using an excimer laser. In the case of the a-Si:H TFT, also, an increase in the film thickness leads to problems such as a rise in the OFF current, an increase in S-D resistance, and an increase in light leakage.

The present invention has been made in order to solve the above-mentioned problems. Accordingly, it is an object of the present invention to provide a display, and a method for manufacturing the same, by which it is possible, in the case of forming switching elements and light sensor elements over an underlying layer of a substrate, to enhance the sensitivity of the light sensor elements, without affecting the characteristics of the switching elements, by controlling the sensitivity characteristic of the light sensor elements separately from the switching elements.

DISCLOSURE OF INVENTION

According to the present invention, there is provided a display including a substrate provided with a plurality of pixels arranged in a matrix pattern, a first active layer constituting switching elements for the pixels and a second active layer constituting light sensor elements, the active layers being formed over an underlying layer of the substrate, wherein the second active layer is higher than the first active layer in light absorption coefficient.

According to the present invention, there is provided a method for manufacturing a display, including the steps of: forming, over an underlying layer of a substrate to be provided with a plurality of pixels in a matrix pattern, a first active layer for constituting switching elements for the pixels; and forming, over the same underlying layer as that over which the first active layer is formed, a second active layer for constituting light sensor elements so that the second active layer is higher than the first active layer in light absorption coefficient.

According to the present invention, further, there is provided a method for manufacturing a display, including the steps of: forming, over an underlying layer of a substrate to be provided with a plurality of pixels in a matrix pattern, a first active layer for constituting switching elements for the pixels; and forming, over the same underlying layer as that over which the first active layer is formed, a second active layer for constituting light sensor elements, in a thickness different from the thickness of the first active layer or by use of a material different from the material for the first active layer.

The "light absorption coefficient" described herein means the proportion of light, per unit area, which is absorbed into an active layer upon incidence of light on the active layer (the ratio of the amount of light absorbed into the active layer, based on the amount of incident light which is taken as 100%). For instance, when the unit area is defined as a size of 1 $\mu m^2$, the ratio (Q2/Q1) of the amount of light incident on the active layer per 1 $\mu m^2$, Q1, to the amount of light absorbed into the active layer per 1 $\mu m^2$, Q2, is the light absorption coefficient.

In the display and the method for manufacturing the same according to the present invention, by a configuration in which the light absorption coefficient of a second active layer for constituting light sensor elements is set to be higher than that of a first active layer for constituting switching elements, the sensitivity characteristic of the light sensor elements can be controlled separately from the switching elements. Therefore, the sensitivity of the light sensor elements can be enhanced, without changing the characteristics of the switching elements.

Besides, in the method for manufacturing the display according to the present invention, by a configuration in which a second active layer is formed over the same underlying layer as that for active layer of 1 for constituting switching elements, in a layer thickness different from that of the first active layer or by use of a material different from the material for the first active layer, the sensitivity characteristic of the light sensor elements can be controlled separately from the switching elements. Therefore, the sensitivity of the light sensor elements can be enhanced, without changing the characteristics of the switching elements.

According to the present invention, the sensitivity of light sensor elements can be enhanced without influencing the characteristics of switching elements, in a display equipped with light sensors.

BRIEF DESCRIPTION OF DRAWINGS

FIG. 34 shows views of a portable terminal device which is a fifth application example of the invention.

BEST MODE FOR CARRYING OUT THE INVENTION

Figure 1:
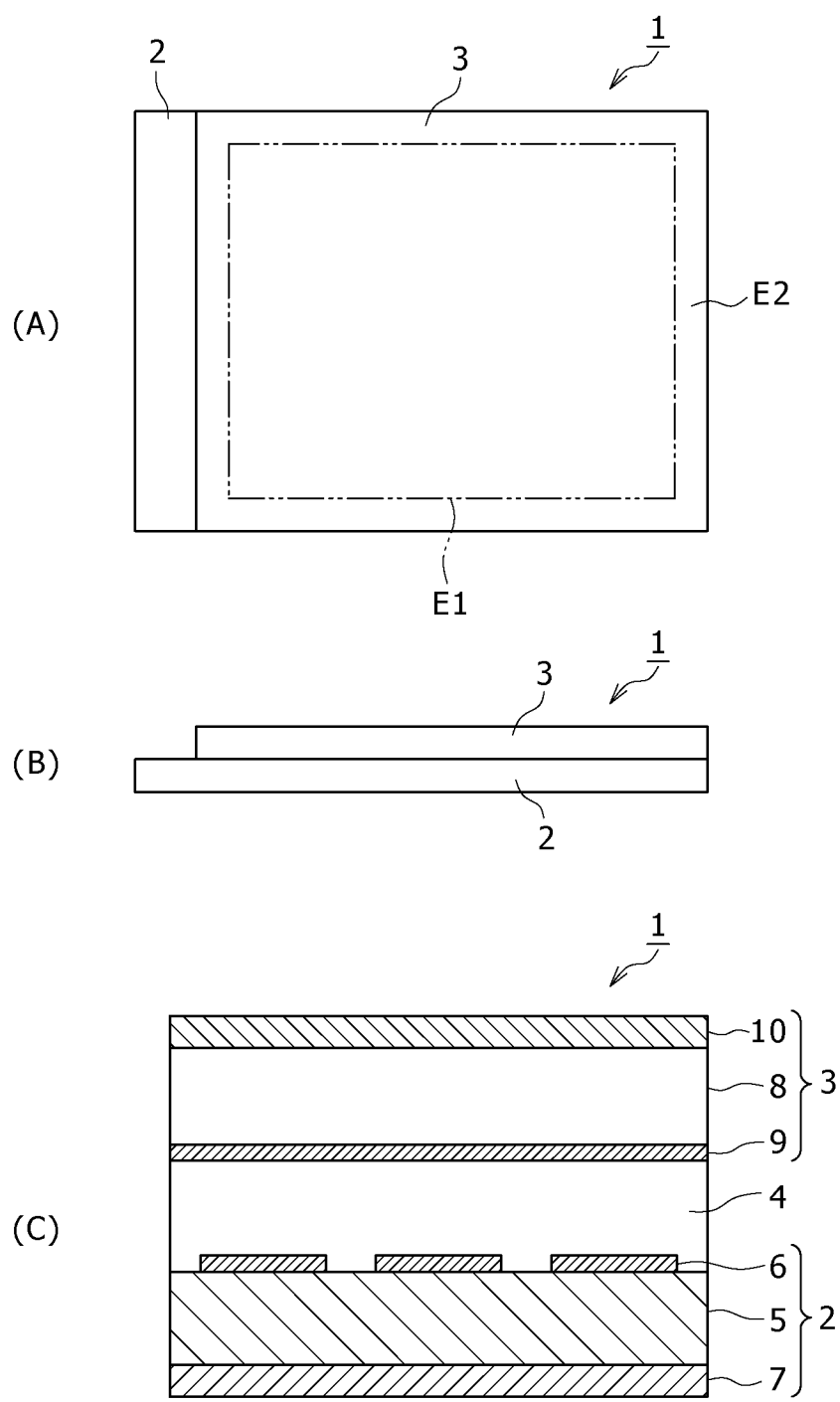
FIG. 1 illustrates a configuration example of a liquid crystal display.

Now, specific embodiments of the present invention will be described in detail below referring to the drawings.

(A) of FIG. 1 is a plan view showing a configuration example of a liquid crystal display, (B) of FIG. 1 is a side view of the same, and (C) of FIG. 1 is a sectional view of a main part of the same. The liquid crystal display 1 shown in the figures has a display panel with a structure in which a driving substrate 2 and an opposite substrate 3 are adhered to each other. The display panel is partitioned into a display area E1, and a peripheral area E2 adjacent to the display area E1. The peripheral area E2 is located in the periphery of the display area E1. A liquid crystal layer 4 is sealed between the driving substrate 2 and the opposite substrate 3 by use of spacers and a seal which are not shown.

The driving substrate 2 is configured by use of a transparent glass substrate (insulating substrate) 5. Pixel electrodes 6 are formed on one side of the glass substrate 5. A polarizing plate 7 is adhered to the other side of the glass substrate 5. The opposite substrate 3 is configured by use of a transparent glass substrate (insulating substrate) 8. A common electrode (opposite electrode) 9 is formed on one side of the glass substrate 8. A polarizing plate 10 is adhered to the other side of the glass substrate 8. The driving substrate 2 and the opposite substrate 3 are arranged in the condition where the pixel electrodes 6 and the common electrode 9 are opposed to each other, with the liquid crystal layer 4 therebetween.

Figure 2:
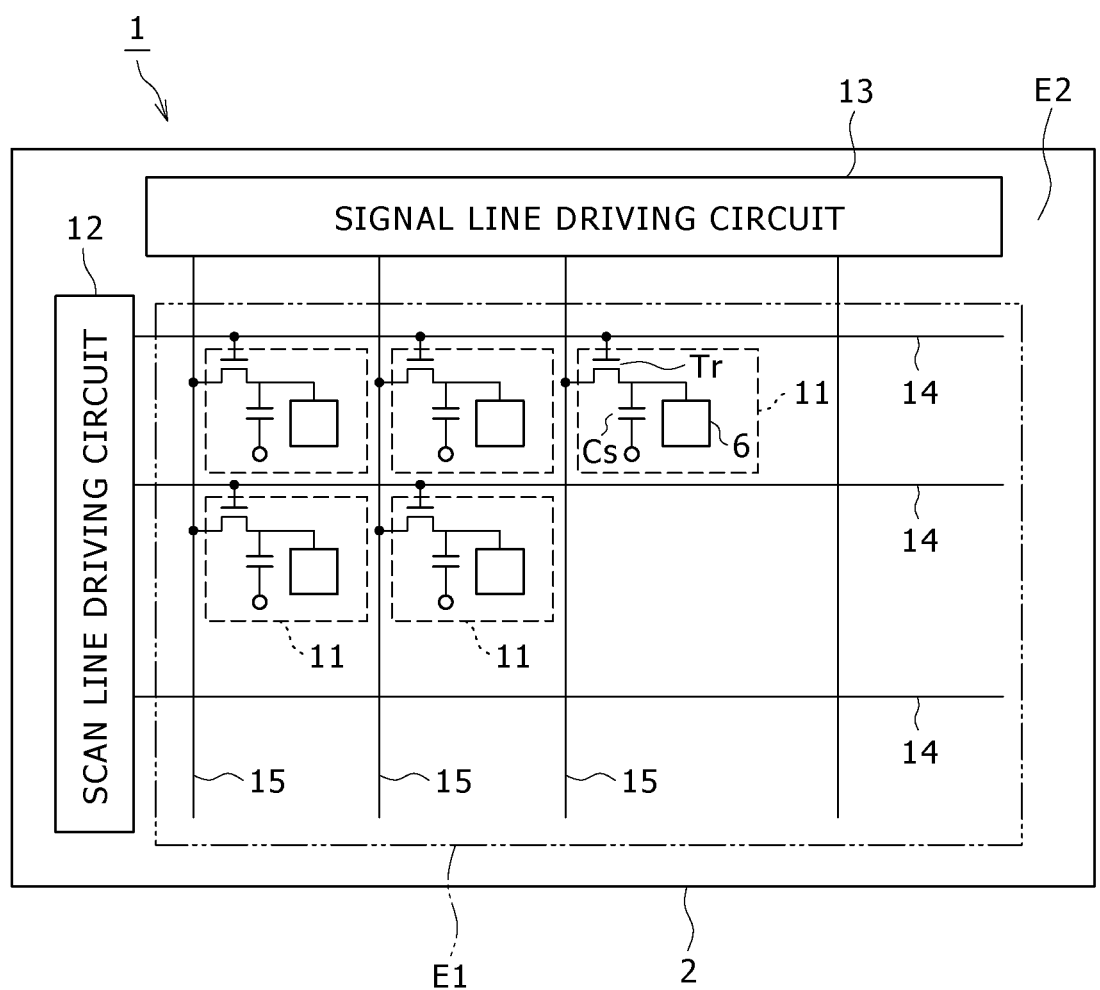
FIG. 2 is a plan diagram showing the configuration of a driving substrate of the liquid crystal display.

As shown in FIG. 2, a plurality of pixels 11 for displaying an image are arranged in a matrix pattern in the display area E1 of the driving substrate 2. A scan line driving circuit 12 and a signal line driving circuit 13 are arranged in the peripheral area E2 of the driving substrate 2. The scan line driving circuit 12 is for selectively driving a plurality of scan lines 14 which are wired in the horizontal direction. The signal line driving circuit 13 is for selectively driving a plurality of signal lines 15 which are wired in the vertical direction. The pixels 11 are provided, one each, at locations where the scan lines 14 and the signal lines 15 intersect in the display area E1 of the driving substrate 2. A pixel circuit is provided in each of pixels 11 including a pixel electrode 6

A pixel circuit is configured, for example, by use of a pixel electrode 6, a thin film transistor Tr and a holding capacitance Cs. The pixel electrode 6 is connected to a drain electrode of the thin film transistor Tr. A gate electrode of the thin film transistor Tr is connected to the scan line 14. A source electrode of the thin film transistor Tr is connected to the signal line 15.

In the pixel circuit configured as above, by driving of the scan line driving circuit 12 and the signal line driving circuit 13, a picture signal written from the signal line 15 through the thin film transistor Tr is held in the holding capacitance Cs, a voltage according to the amount of signal held therein is supplied to the pixel electrode 6, and, according to the voltage, liquid crystal molecules constituting the liquid crystal layer 4 are inclined, whereby transmission of display light is controlled.

Incidentally, the configuration of the pixel circuit as abovementioned is merely an example. If required, a capacitive element may be provided in the pixel circuit, or a plurality of transistors may further be provided in configuring the pixel circuit. Besides, in the peripheral area E2, driving circuits or elements may be added, as required, according to the changes in the pixel circuits.

Figure 3:
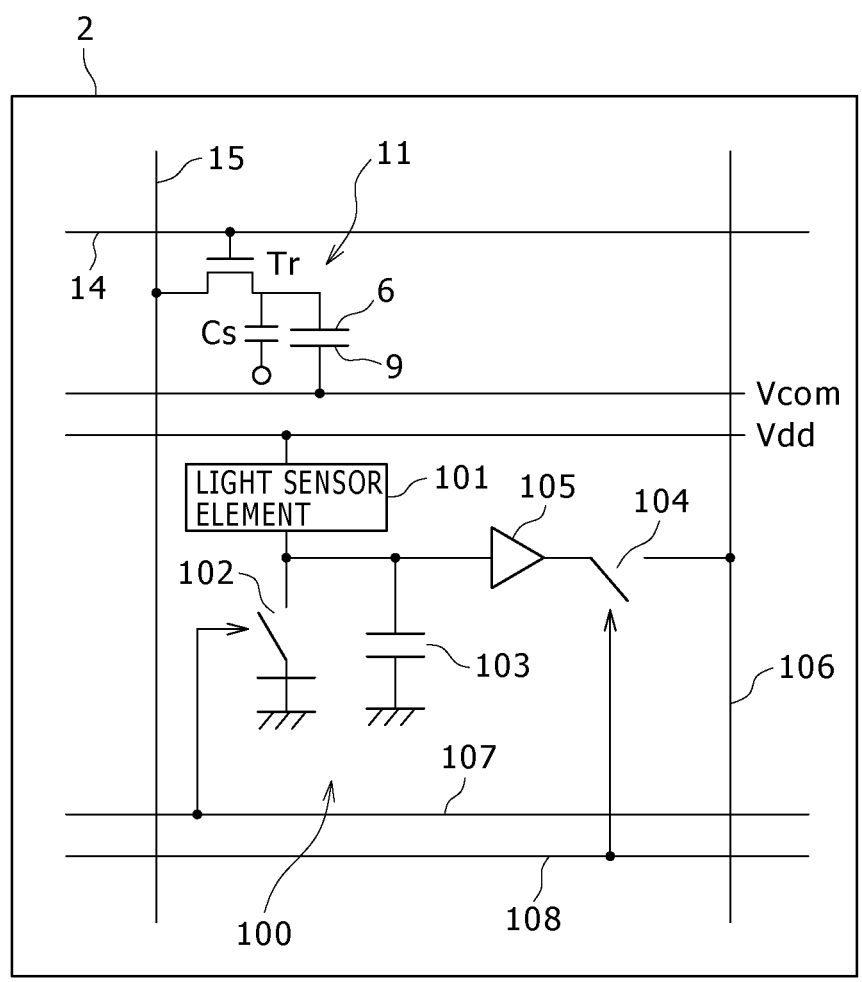
FIG. 3 is a diagram showing the configuration of a circuit in a display area of a display panel.

FIG. 3 is a diagram illustrating the configuration of a circuit in the display area of the display panel. The driving substrate 2 is provided with pixels 11 and sensor parts 100. The pixels 11 and a plurality of the sensor parts 100 are provided in the display area E1. Besides, a plurality of pixels 11 are arranged in a matrix pattern throughout the display area E1, and the plurality of sensor parts 100 are also arranged in a matrix pattern throughout the display area E1. The sensor parts 100 are provided in the display area E1 in the manner of corresponding to the pixels 11. Specifically, it may be contemplated that the sensor parts 100 are arranged in one-to-one correspondence with sub-pixels corresponding respectively to red (R), green (G), and blue (B) colors. Alternatively, it may be contemplated that the sensor parts 100 are arranged in one-to-one correspondence with main pixels each of which is composed of a combination of three sub-pixels for RGB. Further, it may be contemplated that the sensor parts 100 are so arranged that each thereof corresponds to a plurality of main pixels. In addition, the sensor parts 100 may be provided limitedly in a part (predetermined part) of the display area E1, instead of being provided throughout the display area E1. In the case where both the pixels 11 and the sensor parts 100 are provided in the display area E1, the pixels 11 are provided in valid display portions, while the sensor parts 100 are provided in invalid display portions. The valid display portions are those portions which contribute to displaying of an image by controlling the transmission of light through using the liquid crystal layer 4. The invalid display portions are those portions in the display area E1 which are other than the valid display portions.

Figure 4:
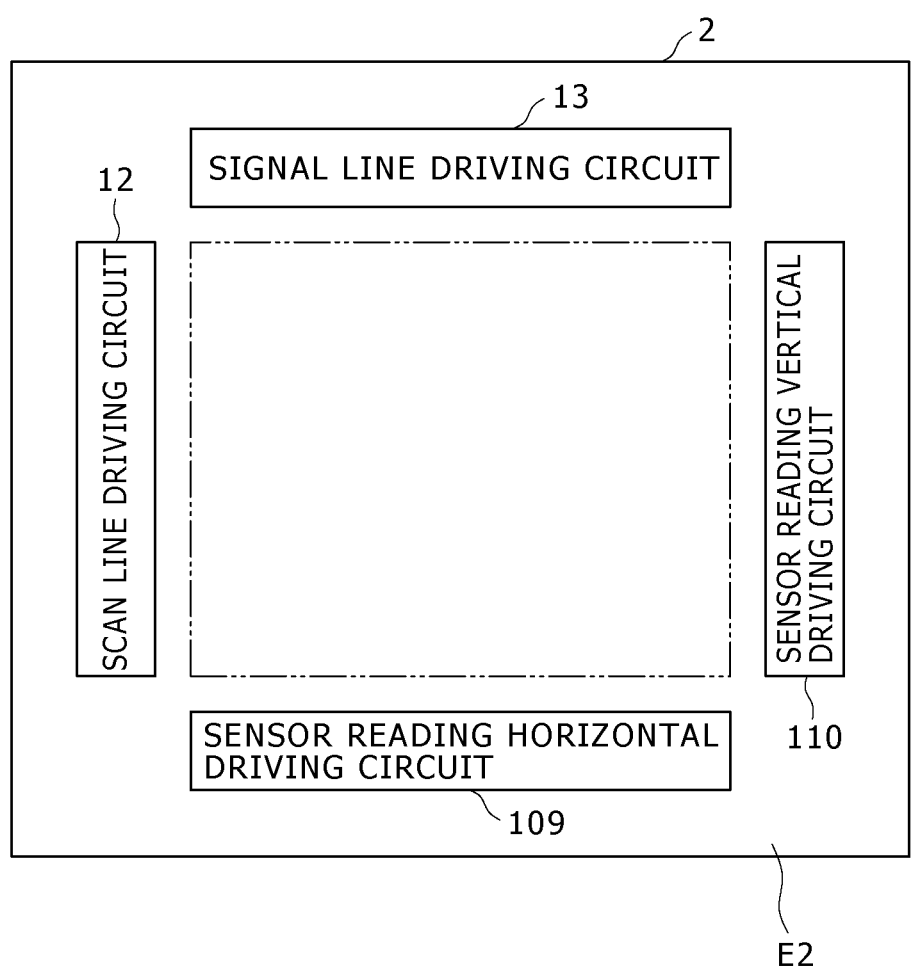
FIG. 4 is a diagram showing an arrangement example of driving circuits in the display panel.

The sensor part 100 has a light sensor element 101. The light sensor element 101 is formed on the driving substrate 2 by manufacturing steps (to be detailed later) concurrent with those for the thin film transistor Tr. The light sensor element 101 is supplied with a power source voltage VDD. In addition, a capacitor (storage capacitance) 103 and a switching element 102 for resetting are connected to the light sensor element 101. The light sensor element 101 is operable to generate electron-hole pairs in response to incidence of light (irradiation with light), thereby producing a photoelectric current according to the amount of light received. The photoelectric current is read out to the exterior of the sensor as a light reception signal of the light sensor element 101. In addition, the light reception signal (signal charge) of the light sensor element 101 is stored in the capacitor 103. The switching element 102 resets the light reception signal stored in the capacitor 103 at a predetermined timing. The light reception signal stored in the capacitor 103 is read out (supplied) to a light reception signal wiring 106 through a buffer amplifier 105 at the timing of turning-ON of a switching element 104 for reading, to be outputted to the exterior. The ON/OFF operations of the switching element 102 for resetting are controlled by a reset signal supplied through a reset control line 107. In addition, the ON/OFF operations of the switching element 104 for reading are controlled by a read signal supplied through a read control line 108. Reading of the light reception signal of the light sensor element 101 is conducted, for example, by a sensor reading horizontal driving circuit 109 and a sensor reading vertical driving circuit 110 which are provided in the peripheral area E2 of the driving substrate 2 constituting the display panel, as shown in FIG. 4.

First Embodiment

Figure 5:
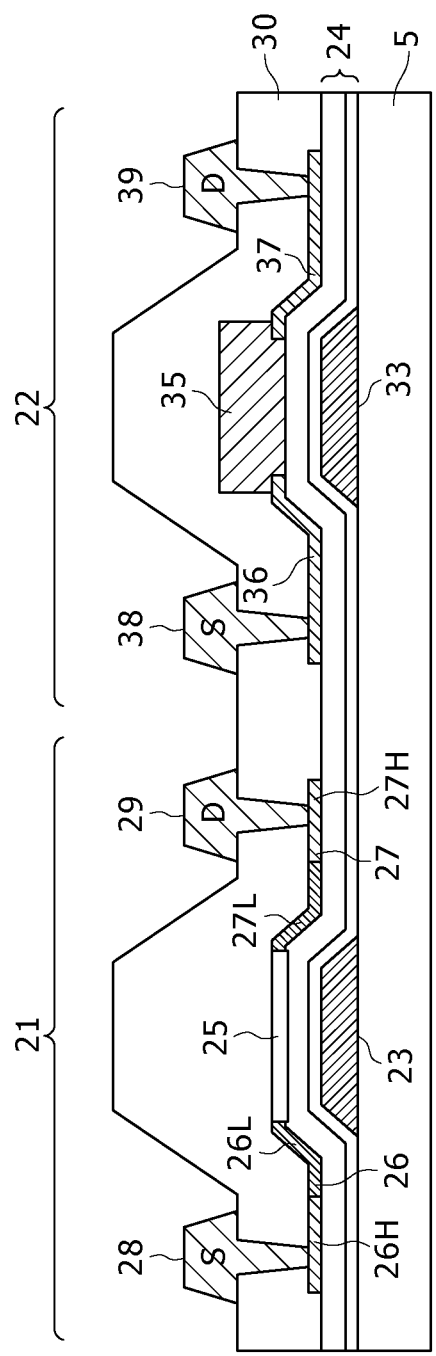
FIG. 5 is a sectional view showing a main part of a driving substrate in a liquid crystal display according to a first embodiment of the present invention.

FIG. 5 is a sectional view showing a main part of a driving substrate 2 of a liquid crystal display 1 according to a first embodiment of the present invention. As shown in the figure, over a glass substrate 5 serving as a base of the driving substrate 2, first element forming portions 21 for configuring switching elements (thin film transistors Tr) for pixels 11 and second element forming portions 22 for configuring light sensor elements 101 of sensor parts 100 are provided. In plan view of the glass substrate 5 as viewed from the side of the liquid crystal layer 4 shown in FIG. 1, the first element forming portions 21 are arranged in the display area E1 together with the pixels 11, and the second element forming portions 22 are arranged in the display area E1 together with the sensor parts 100. It is to be noted here, however, that this configuration is not limitative; for example, the first element forming portions 21 may be arranged in both the display area E1 and the peripheral area E2. In addition, the second element forming portions 22 may be arranged in the peripheral area E2, or may be arranged in both the display area E1 and the peripheral area E2. In FIG. 5, for convenience of description, the first element forming portion 21 and the second element forming portion 22 are adjacently illustrated side by side, but their arrangement is not particularly limited to this side-by-side layout.

The first element forming portion 21 includes a gate electrode 23 formed over the glass substrate 5, a channel layer 25 opposed to the gate electrode 23 with a gate insulating film 24 therebetween, and a source 26 and a drain 27 which are located respectively on both sides of the channel layer 25. The gate electrode 23 is formed by use of a high melting point metal such as chromium and molybdenum, for example. The gate insulating film 24 is a highly light-transmitting film (transparent insulating film), which has a two-layer structure composed of a silicon nitride film and a silicon oxide film, for example.

The channel layer 25 is provided in the first element forming portion 21 as "first active layer," and is formed so as to be stacked on the gate insulating film 24, with the gate insulating film 24 serving as an underlying layer. Correspondingly to the layout of the first element forming portions 21 as above-mentioned, the channel layers 25 are arranged in at least the display area E1, of the display area E and the peripheral area E2. That is, the channel layers 25 are arranged in only the display area E1, or in both the display area E1 and the peripheral area E2. The channel layer 25 is operable to form an n-type channel between the source 26 and the drain 27 on the side of facing the gate electrode 23 when the transistor is ON. The channel layer 5 is formed by use of polycrystalline silicon, for example.

The source 26 and the drain 27 are $n^+$-type impurity diffusion regions. The source 26 has a high-concentration impurity region 26H and a low-concentration impurity region 26L, and the drain 27 similarly has a high-concentration impurity region 27H and a low-concentration impurity region 27L. The low-concentration impurity region 26L of the source 26 is adjacent to the channel layer 25, and the low-concentration impurity region 27L of the drain 27 is also adjacent to the channel layer 25. The structure in which the low-concentration impurity diffusion regions are provided on both sides of the channel layer 25 in this manner is called an LDD (Lightly Doped Drain) structure.

The high-concentration impurity region 26H of the source 26 is a region where resistance is lowered for contact, and a source electrode 28 is connected to the high-concentration impurity region 26H. Similarly, the high-concentration impurity region 27H of the drain 27 is a region where resistance is lowered for contact, and a drain electrode 29 is connected to the high-concentration impurity region 27H. The source electrode 28 and the drain electrode 29 are each formed in the state of penetrating an inter-layer insulating film 30. The inter-layer insulating film 30 is a highly light-transmitting film (transparent insulating film), and is formed by a silicon oxide film, for example.

The second element forming portion 22 includes a gate electrode 33 formed over the glass substrate 5, a photoelectric conversion layer 35 opposed to the gate electrode 33 with the above-mentioned gate insulating film 24 therebetween, and a source 36 and a drain 37 which are located respectively on both sides of the photoelectric conversion layer 35.

The photoelectric conversion layer 35 is provided in the second element forming portion 22 as "second active layer." Correspondingly to the layout of the second element forming portions 22 as above-mentioned, the photoelectric conversion layers 35 are arranged in at least one of the display area E1 and the peripheral area E2. That is, the photoelectric conversion layers 35 are arranged in only the display area E1, in only the peripheral area E2, or in both of the areas. The photoelectric conversion layer 35 is formed over the gate insulating film 24 by use of a material different from the material of the channel layer 25. Specifically, for example, the photoelectric conversion layer 35 is formed by using amorphous silicon (a-Si), amorphous germanium (a-Ge), amorphous silicon-germanium (a-SixGe1), a stacked layer of silicon and germanium, a layer of a material obtained by refining the crystal grain diameter of the materials to the nanometer level (microcrystallizing), or the like. In some cases, the photoelectric conversion layer 35 may be formed by use of carbon.

The photoelectric conversion layer 35 is formed on the upper side of the gate electrode 33 in the state of partly covering the opposed parts of the source 36 and the drain 37. The photoelectric conversion layer 35 is formed to be thicker than the channel layer 25. For instance, where the thickness of the channel layer 25 is set in the range of from 50 nm, inclusive, to 100 nm, exclusive, in consideration of the OFF current of the transistors, the series resistance thereof and the like factors, the thickness of the photoelectric conversion layer 35 is set to be not less than 100 nm, the value being greater than the thickness of the channel layer 25.

The source 36 and the drain 37 are $n^+$-type impurity diffusion regions. A source electrode 38 is connected to the source 36, and a drain electrode 39 is connected to the drain 37. The source electrode 38 and the drain electrode 39 are each formed in the state of penetrating the inter-layer insulating film 30.

Thus, by a configuration in which the photoelectric conversion layer 35 is formed of a material different from the material for the channel layer 25 or by a configuration in which the photoelectric conversion layer 35 is formed to be thicker than the channel layer 25, it is ensured that the light absorption coefficient (particularly, absorption coefficients for visible light and infrared light) of the photoelectric conversion layer 35 is higher than the light absorption coefficient of the channel layer 25. To be more specific, when the photoelectric conversion layer 35 is formed by use of a material higher in light-absorbing property than the material forming the channel layer 25, the light absorption coefficient of the photoelectric conversion layer 35 will be higher than the light absorption coefficient of the channel layer 25. Besides, when the same material is used to form the two layers but the photoelectric conversion layer 35 is formed to be thicker than the channel layer 25, the light absorption coefficient of the photoelectric conversion layer 35 will be higher than the light absorption coefficient of the channel layer 25. In other words, in the case where the photoelectric conversion layer 35 is formed to be equal to or smaller than the channel layer 25 in thickness, the light absorption coefficient of the photoelectric conversion layer 35 can be made higher than that of the channel layer 25 by forming the photoelectric conversion layer 35 from a material (a material having a higher light-absorbing property) different from the material for the channel layer 25. In addition, in the case where the photoelectric conversion layer 35 and the channel layer 25 are formed from the same material, the light absorption coefficient of the photoelectric conversion layer 35 can be made higher than the light absorption coefficient of the channel layer 25 by setting the thickness of the photoelectric conversion layer 35 to be larger than the thickness of the channel layer 25. Further, when the photoelectric conversion layer 35 is formed from a material higher in light-absorbing property than the material of the channel layer 25 and the photoelectric conversion layer 35 is formed to be thicker than the channel layer 25, the light absorption coefficient of the photoelectric conversion layer 35 can be further enhanced, as compared to the channel layer 25.

As a result of this, the number of electron-hole pairs generated due to incidence of light on the photoelectric conversion layer 35, in the case where the second element forming portion 22 is made to function as a light sensor element, is increased. Therefore, a further larger photoelectric current can be obtained, as compared to the case where the photoelectric conversion layer is formed from the same material as the material for the first element forming portion 21 and in the same thickness as the thickness of the first element forming portion 21. Consequently, the sensitivity of the light sensor elements can be enhanced without influencing the thin film transistors Tr constituting the switching elements for the pixels 11.

Figure 6:
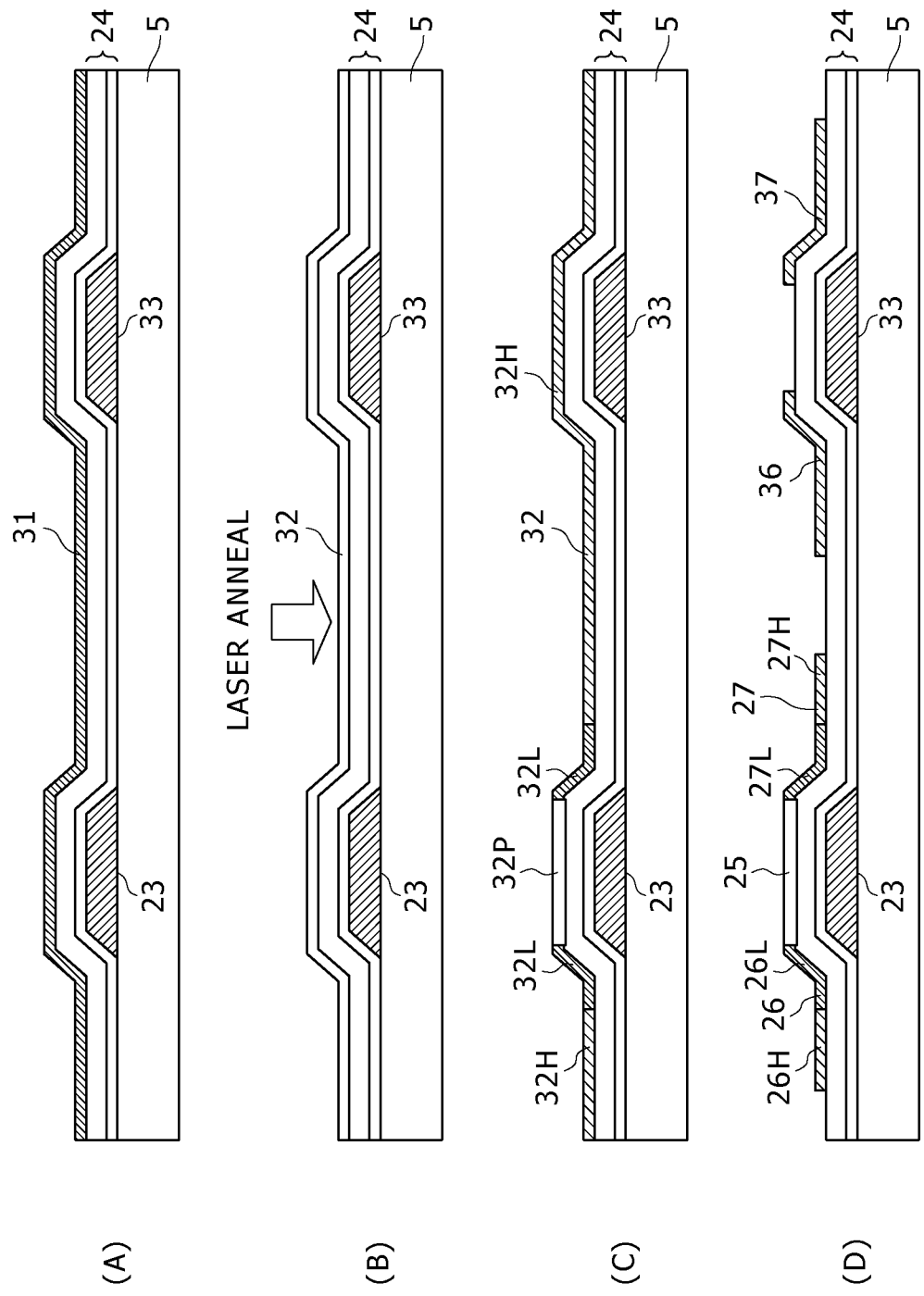
FIG. 6 shows views (No. 1) illustrating a method for manufacturing the liquid crystal display according to the first embodiment of the invention.
Figure 7:
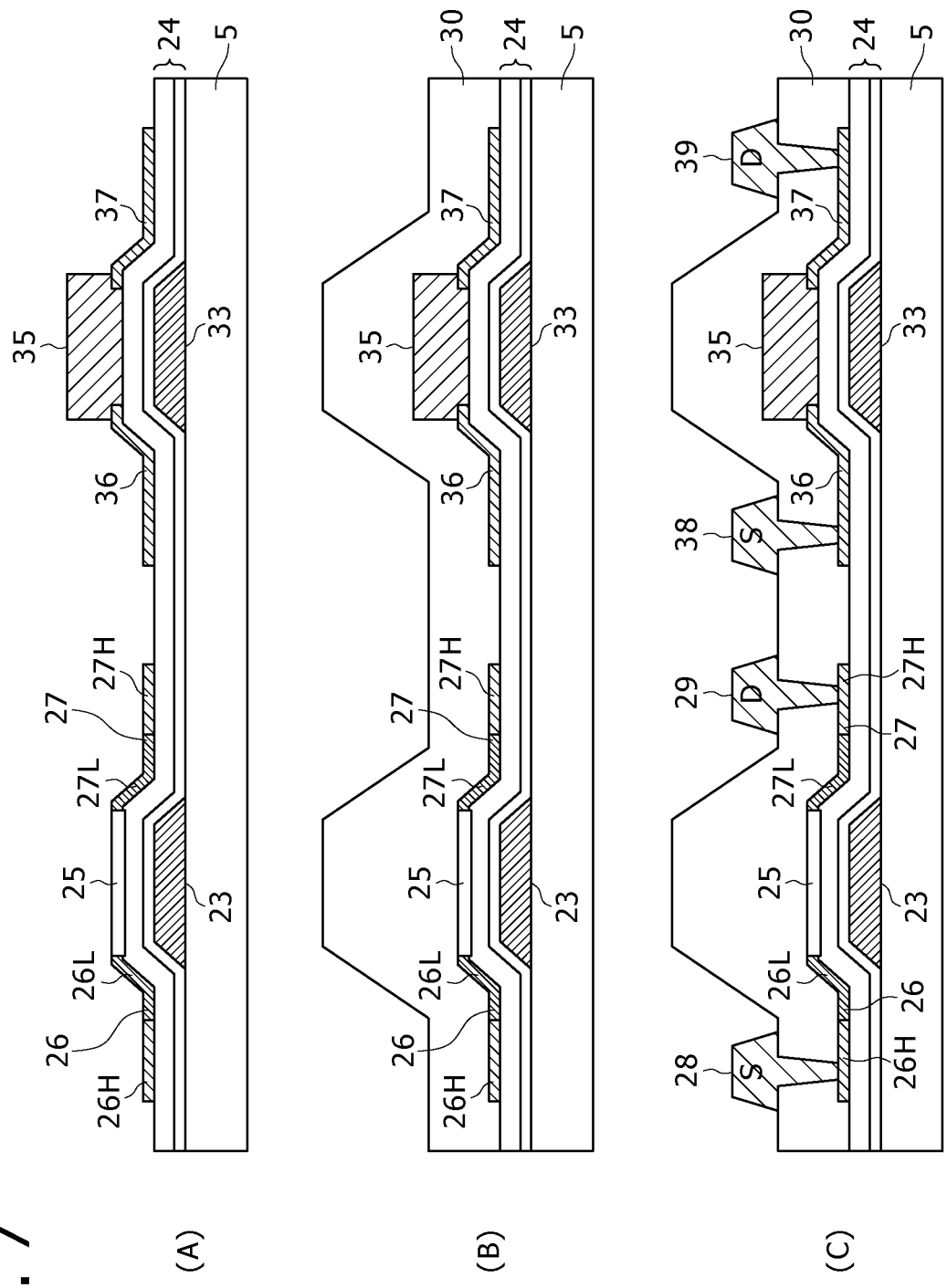
FIG. 7 shows views (No. 2) illustrating the method for manufacturing the liquid crystal display according to the first embodiment of the invention.

FIGS. 6 and 7 show views illustrating a method for manufacturing the liquid crystal display according to the first embodiment of the present invention. As shown in (A) of FIG. 6, gate electrodes 23, 33 and a gate insulating film 24 are formed over a glass substrate 5 to be provided with the above-mentioned plurality of pixels 11 in a matrix pattern, and then a semiconductor film 31 of amorphous silicon is formed in the state of covering the gate insulating film 24. The gate insulating film 24 is formed, for example, by sequentially forming a silicon nitride film and a silicon oxide film over the glass substrate 5 by a PECVD (plasma enhanced chemical vapor deposition) method or the like. The semiconductor film 31 is formed over the glass substrate 5 so as to range over the first element forming portion 21 and the second element forming portion 22.

Next, as shown in (B) of FIG. 6, the amorphous semiconductor film 31 is polycrystallized by laser anneal, whereby a semiconductor film 32 of polycrystalline silicon is obtained. At this stage, the polycrystalline semiconductor film 32 has been formed over the glass substrate 5.

Subsequently, as shown in (C) of FIG. 6, an impurity is introduced into the polycrystalline semiconductor film 32 in a region on the upper side of the gate electrode 23, exclusive of a polycrystalline silicon portion for constituting the channel layer 25, by, for example, ion doping, ion implantation, plasma implantation or the like, whereby the semiconductor film 32 is partitioned into a polycrystalline silicon region 32P, a high-concentration impurity region 32H, and a low-concentration impurity region 32L.

Next, as shown in (D) of FIG. 6, the semiconductor film 32 is separated into island-like shapes by wet etching or dry etching in parts which correspond to the first element forming portion 21 and the second element forming portion 22, whereby the channel layer 25 and a source 26 and a drain 27 are formed on the side of the gate electrode 23 included in the first element forming portion 21, while a source 36 and a drain 37 are formed on the side of the gate electrode 33 included in the second element forming portion 22. In this instance, the source 26 is partitioned into the high-concentration impurity region 26H and the low-concentration impurity region 26L, and the drain 27 is similarly partitioned into the high-concentration impurity region 27H and the low-concentration impurity region 27L. In addition, on the upper side of the gate electrode 33, the semiconductor film 32 in a part corresponding to the active layer (photoelectric conversion layer) (a part corresponding, on a structural basis, to the channel layer of the transistor) is removed, whereby the surface of the gate insulating film 24 is exposed between the source 36 and the drain 37.

Subsequently, as shown in (A) of FIG. 7, in the part where the semiconductor film 32 has been removed (the part corresponding to the active layer) on the upper side of the gate electrode 33, a photoelectric conversion layer 35 is formed by a selective film forming method, for example, a printing method such as an ink jet film forming method, etc., a photo CVD method such as laser CVD, etc., a stamping method or the like. In the ink jet film forming method and the photo CVD method, the film thickness can be controlled arbitrarily. Here, therefore, the photoelectric conversion layer 35 is formed in a film thickness greater than that of the semiconductor film 32.

Next, as shown in (B) of FIG. 7, an inter-layer insulating film 30 is formed over the glass substrate 5 in the state of covering the channel layer 25, the source 26 and the drain 27 and also covering the photoelectric conversion layer 35, the source 36 and the drain 37.

Subsequently, as shown in (C) of FIG. 7, a contact hole reaching the high-concentration impurity region 26H of the source 26 and a contact hole reaching the high-concentration impurity region 27H of the drain 27 are formed respectively on both sides of the channel layer 25, and a source electrode 28 and a drain electrode 29 are formed in the inter-layer insulating film 30 in the state of filling up these contact holes with a wiring material. Besides, concurrently with this, a contact hole reaching the source 36 and a contact hole reaching the drain 37 are formed respectively on both sides of the photoelectric conversion layer 35, and a source electrode 38 and a drain electrode 39 are formed in the state of filling up these contact holes with a wiring material.

By the manufacturing method as above, the switching elements (thin film transistors) each including the channel layer 25 and the light sensor elements each including the photoelectric conversion layer 35 can be formed over the same glass substrate 5. In addition, the channel layer 25 constituting the switching element (thin film transistor) for the pixel in the first element forming portion 21 and the photoelectric conversion layer 35 constituting the light sensor element in the second element forming portion 22 can be formed from different materials and in different thicknesses.

Incidentally, in the case where the channel layer 25 constituting the switching element and the photoelectric conversion layer 35 constituting the light sensor element are separately formed by a PECVD method, a sputtering method or the like, the film formation occurs not only in the locations corresponding to the active layers but also in unrequired locations, and, therefore, the unrequired portions have to be removed by etching or the like after the film formation. Due to this need, the steps would be very complicated. Besides, the etching may damage the elements or may increase the amount of particles. On the other hand, where the photoelectric conversion layer 35 is formed in the parts corresponding to the active layers in the second element forming portions 22 as abovementioned, such problems as just-mentioned can be obviated.

Second Embodiment

Figure 8:
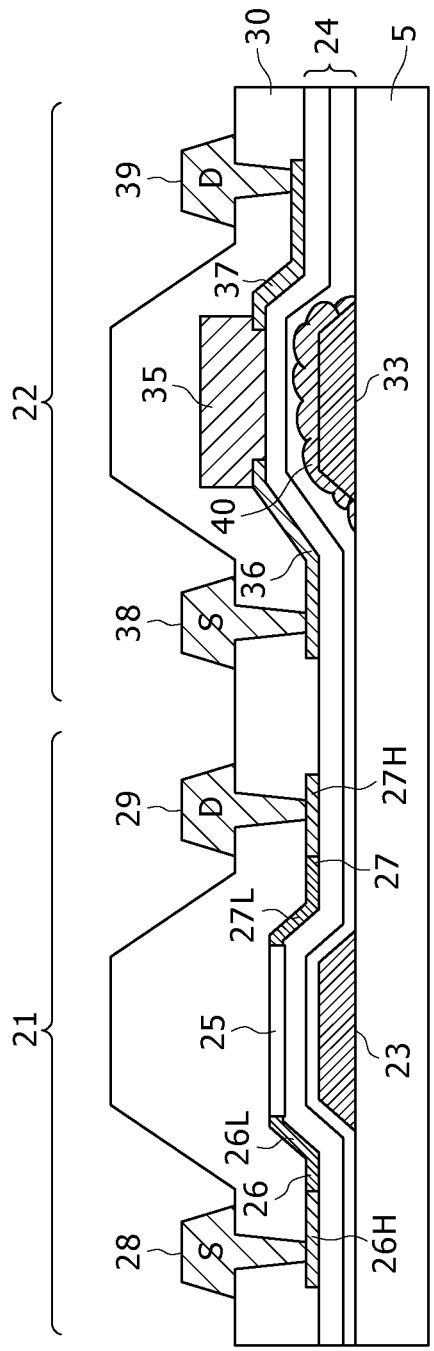
FIG. 8 is a sectional view showing a main part of a driving substrate in a liquid crystal display according to a second embodiment of the invention.

FIG. 8 is a sectional view showing a main part of a driving substrate 2 in a liquid crystal display 1 according to a second embodiment of the present invention. The second embodiment differs from the above-described first embodiment, particularly in that a light reflecting film 40 is provided on a gate electrode 33 in a second element forming portion 22. The light reflecting film 40 is formed on a surface of the gate electrode 33 which is disposed closest to and opposite to the photoelectric conversion layer 35 on the side opposite to the side of incidence of external light. In addition, the light reflecting film 40 is formed by use of a metallic material which is at least higher than the gate electrode 33 in reflectance, for example, silver.

With the light reflecting film 40 thus provided so as to cover the gate electrode 33, the light having externally entered and passed through the photoelectric conversion layer 35 is efficiently reflected by the light reflecting film 40, and the thus reflected light again enters the photoelectric conversion layer 35 as return light. Therefore, the number of times the external light is incident on the photoelectric conversion layer 35 is increased. As a result, the number of electron-hole pairs generated in the photoelectric conversion layer 35 is increased, and the sensitivity of the light sensor element is enhanced.

Figure 9:
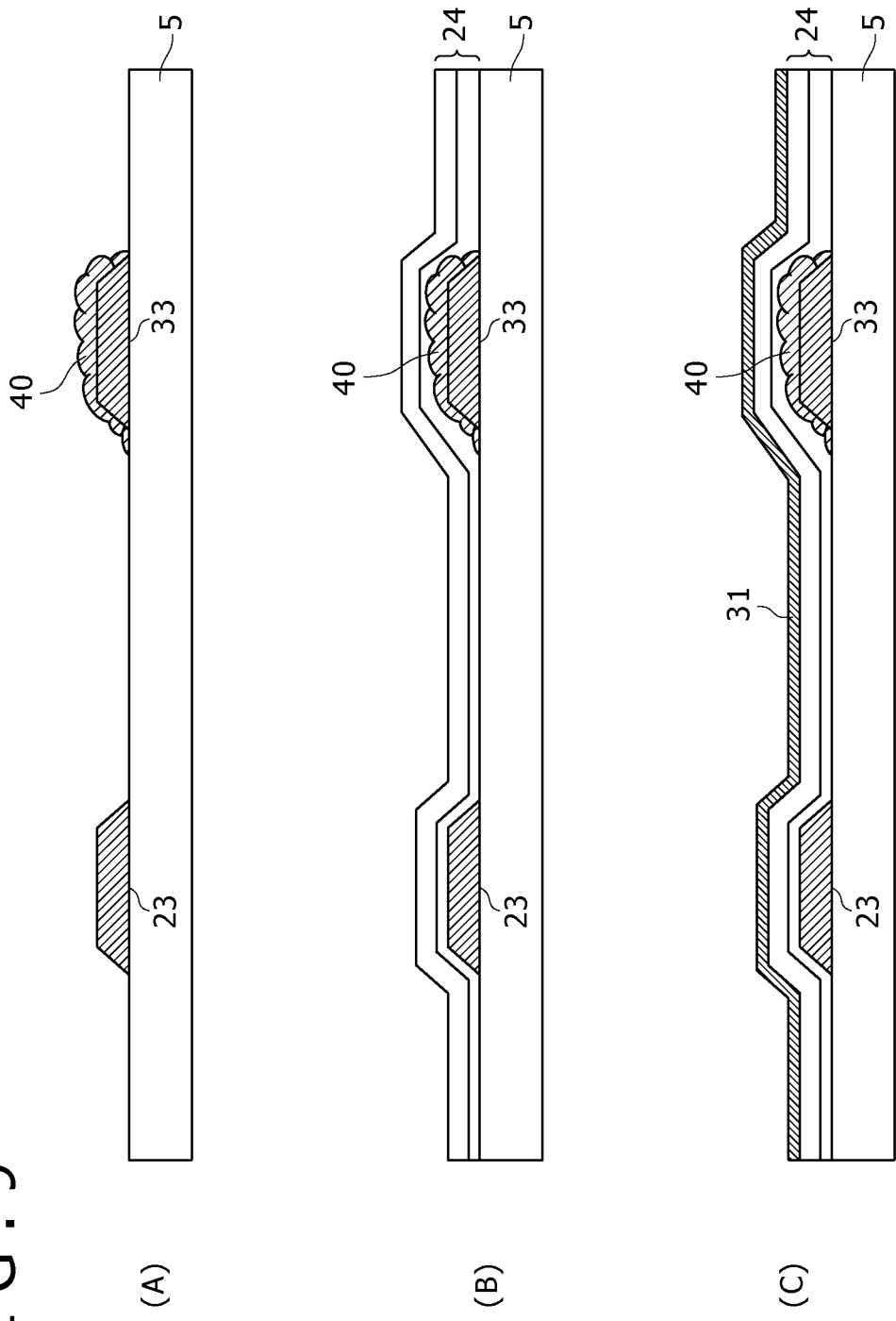
FIG. 9 shows views (No. 1) illustrating a method for manufacturing the liquid crystal display according to the second embodiment of the invention.
Figure 10:
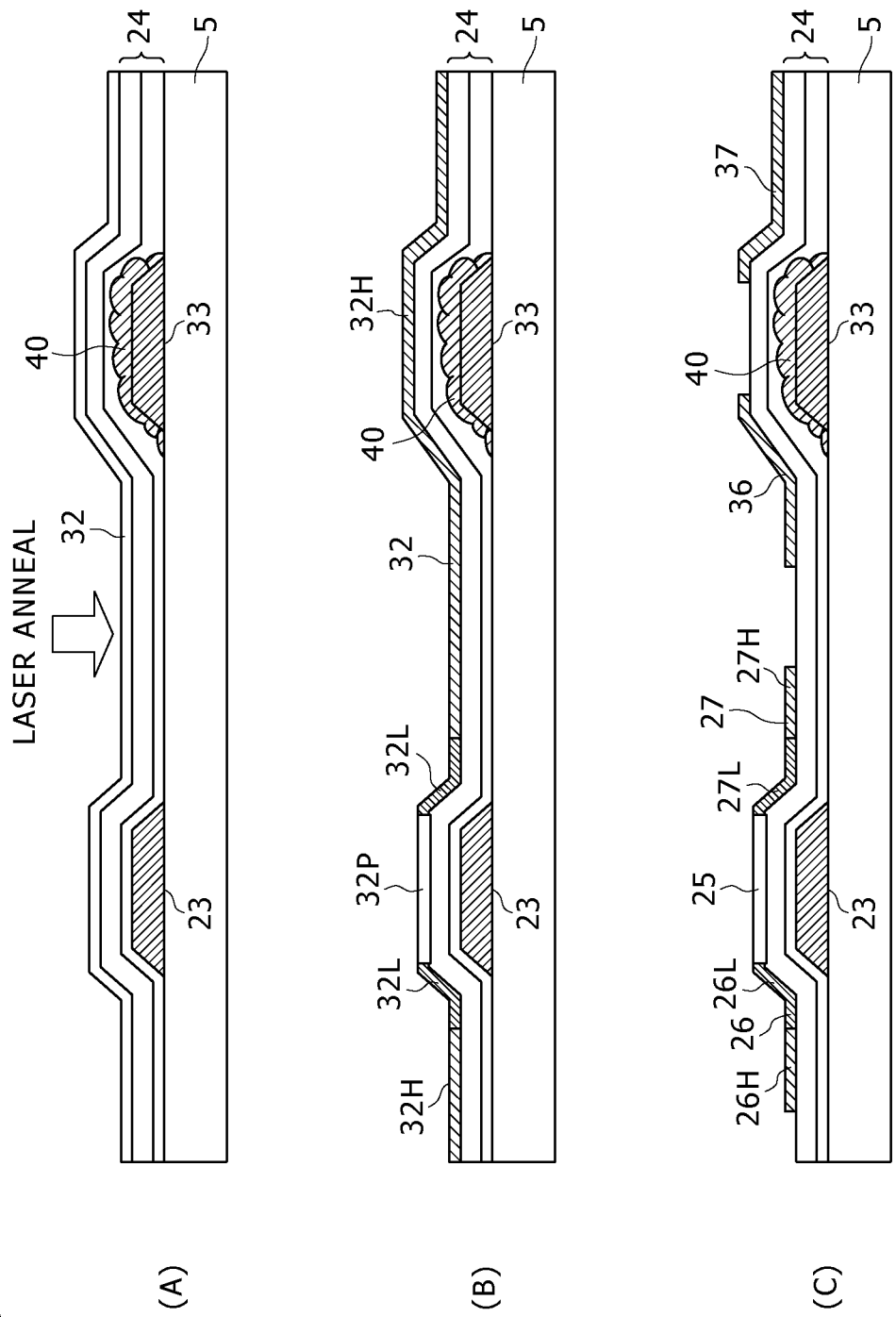
FIG. 10 shows views (No. 2) illustrating the method for manufacturing the liquid crystal display according to the second embodiment of the invention.
Figure 11:
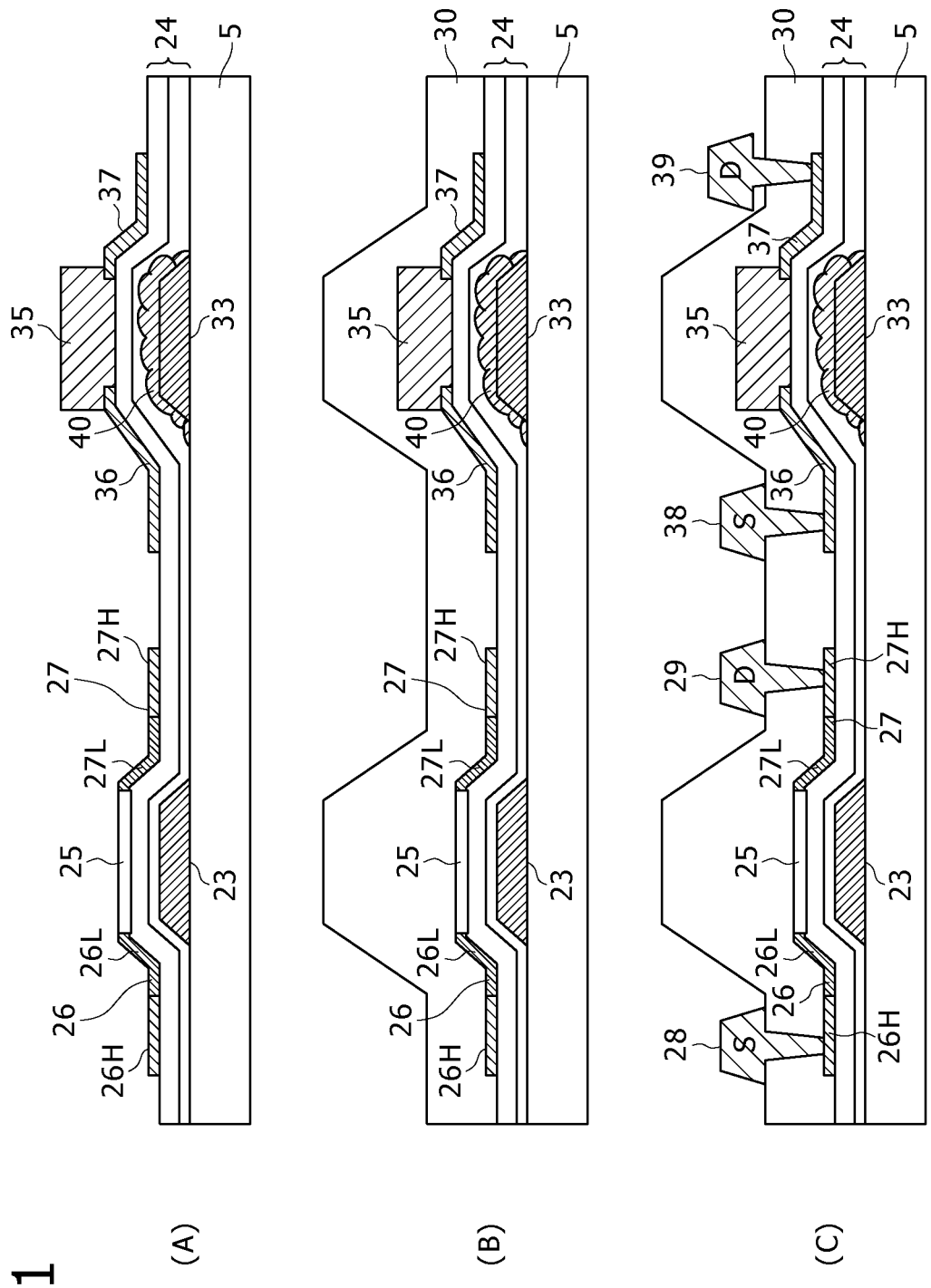
FIG. 11 shows views (No. 3) illustrating the method for manufacturing the liquid crystal display according to the second embodiment of the invention.

FIGS. 9 to 11 show views illustrating a method for manufacturing the liquid crystal display according to the second embodiment of the present invention. First, as shown in (A) of FIG. 9, gate electrodes 23, 33 are formed over the glass substrate 5 to be provided with the plurality of pixels 11 in a matrix pattern. Thereafter, over the gate electrode 33 on one side, a film of silver is selectively formed by, for example, an ink jet film forming method in the state of covering the gate electrode 33, to form the light reflecting film 40.

Next, as shown in (B) of FIG. 9, a silicon nitride film and a silicon oxide film are sequentially formed over the glass substrate 5 in the state of covering the gate electrode 23 and the light reflecting film 40 on the gate electrode 33 by, for example, a PECVD (plasma enhanced chemical vapor deposition) method, to form a gate insulating film 24.

Subsequently, as shown in (C) of FIG. 9, a semiconductor film 31 of amorphous silicon is formed in the state of covering the gate insulating film 24, by a PECVD method or the like. The semiconductor film 31 is formed over the glass substrate 5, so as to range over the above-mentioned first element forming portion 21 and second element forming portion 22.

Next, as shown in (A) of FIG. 10, the amorphous semiconductor film 31 is polycrystallized by laser anneal, to obtain a semiconductor film 32 of polycrystalline silicon. At this stage, the polycrystalline semiconductor film 32 has been formed over the glass substrate 5.

Subsequently, as shown in (B) of FIG. 10, an impurity is introduced into the polycrystalline semiconductor film 32 in a region on the upper side of the gate electrode 23, exclusive of a polycrystalline silicon portion for constituting the channel layer 25, by, for example, ion doping, ion implantation, plasma implantation or the like, whereby the semiconductor film 32 is partitioned into a polycrystalline silicon region 32P, a high-concentration impurity region 32H, and a low-concentration impurity region 32L. In this case, before conducting the ion implantation or the like, an oxide or the like may be formed by a sputtering method for the purpose of protecting the semiconductor film 32.

Next, as shown in (C) of FIG. 10, the semiconductor film 32 is separated into island-like shape by wet etching or dry etching in parts which correspond to the first element forming portion 21 and the second element forming portion 22, whereby a source 26 and a drain 27 are formed on the side of the gate electrode 23 included in the first element forming portion 21, while a source 36 and a drain 37 are formed on the side of the gate electrode 33 included in the second element forming portion 22. In this instance, the source 26 is partitioned into the high-concentration impurity region 26H and the low-concentration impurity region 26L, and the drain 27 is similarly partitioned into the high-concentration impurity region 27H and the low-concentration impurity region 27L. In addition, on the upper side of the gate electrode 33 (the light reflecting film 40), the semiconductor film 32 in a part corresponding to the active layer (photoelectric conversion layer) is removed, whereby the gate insulating film 24 is exposed between the source 36 and the drain 37.

Subsequently, as shown in (A) of FIG. 11, in the part where the semiconductor film 32 has been removed on the upper side of the gate electrode 33 (the light reflecting film 40), a photoelectric conversion layer 35 is formed by a selective film forming method, for example, a printing method such as an ink jet film forming method, etc., a photo CVD method such as laser CVD, etc., a stamping method or the like. In the ink jet film forming method and the photo CVD method, the film thickness can be controlled arbitrarily. Here, therefore, the photoelectric conversion layer 35 is formed in a film thickness greater than that of the semiconductor film 32.

Next, as shown in (B) of FIG. 11, an inter-layer insulating film 30 is formed over the glass substrate 5 in the state of covering the channel layer 25, the source 26 and the drain 27 and also covering the photoelectric conversion layer 35, the source 36 and the drain 37.

Subsequently, as shown in (C) of FIG. 11, a contact hole reaching the high-concentration impurity region 26H of the source 26 and a contact hole reaching the high-concentration impurity region 27H of the drain 27 are formed respectively on both sides of the channel layer 25, and a source electrode 28 and a drain electrode 29 are formed in the inter-layer insulating film 30 in the state of filling up these contact holes with a wiring material. Besides, concurrently with this, a contact hole reaching the source 36 and a contact hole reaching the drain 37 are formed respectively on both sides of the photoelectric conversion layer 35, and a source electrode 38 and a drain electrode 39 are formed in the state of filling up these contact holes with a wiring material.

By the manufacturing method as above, the switching elements (thin film transistors) each including the channel layer 25 and the light sensor elements each including the photoelectric conversion layer 35 can be formed over the same glass substrate 5. In addition, the channel layer 25 constituting the switching element (thin film transistor) for the pixel in the first element forming portion 21 and the photoelectric conversion layer 35 constituting the light sensor element in the second element forming portion 22 can be formed from different materials and in different thicknesses. Furthermore, in the second element forming portion 22, the light reflecting film 40 can be provided on the gate electrode 33.

Third Embodiment

Figure 12:
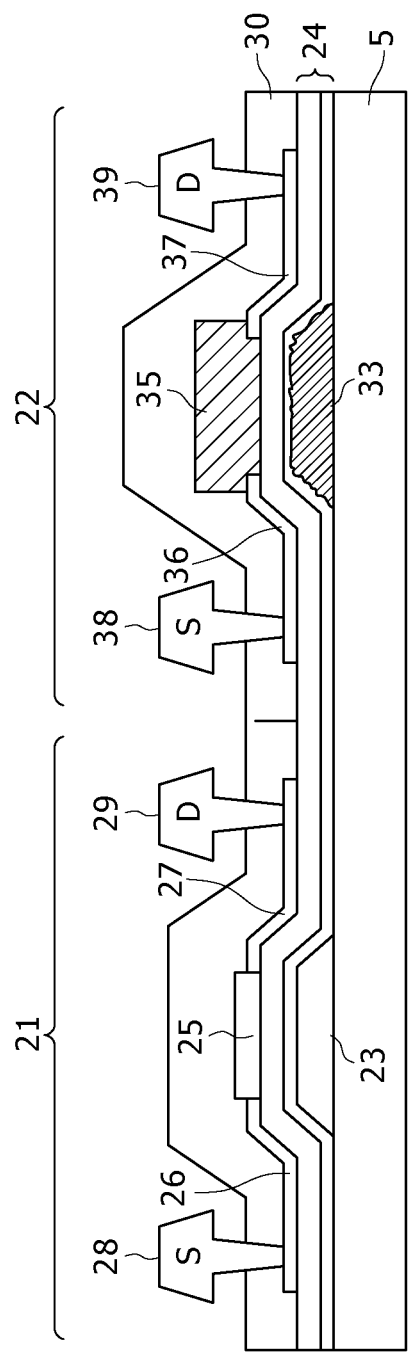
FIG. 12 is a sectional view showing a main part of a driving substrate in a liquid crystal display according to a third embodiment of the invention.

FIG. 12 is a sectional view showing a main part of a driving substrate 2 in a liquid crystal display 1 according to a third embodiment of the present invention. The third embodiment differs from the above-described first embodiment, particularly in that a transparent electrode is used as a gate electrode 23 in a first element forming portion 21 for realizing a transparent LCD (Liquid Crystal Display), that sources 26, 36 and drains 27, 37 are each formed by a transparent conductive film, that transparent electrodes are used as source electrodes 28, 38 and drain electrodes 29, 39, that a channel layer 25 is formed by a transparent semiconductor film, that a gate electrode 33 is formed as a metallic shielding electrode, and that second element forming portions 22 are arranged only in a peripheral area E2.

The gate electrode 23 is formed by use of a transparent conductive material, for example, ITO. The sources 26, 36 and the drains 27, 37 are each formed by use of a transparent conductive material such as ITO (Indium Tin Oxide), ZnO (zinc oxide), FZO (fluorine-containing ZnO), GZO (gallium-containing ZnO), FGZO (fluorine- and gallium-containing ZnO), and AZO (aluminum-containing ZnO).

The source electrodes 28, 38 and the drain electrodes 29, 39 are each formed by use of Tl/Al/Tl, for example. The channel layer 25 is formed by use of InGaZnO and IZO, for example. The gate electrode 33 is formed by use of silver, for example.

Thus, in the liquid crystal display 1 according to the third embodiment, the channel layer 25 in the first element forming portion 21 is formed from a transparent oxide semiconductor, while a photoelectric conversion layer 35 in a second element forming portion 22 is formed in a larger thickness by use of a material (amorphous silicon or the like) higher than the transparent oxide semiconductor in light-absorbing property, whereby the light absorption coefficient (particularly, absorption coefficients for visible light and infrared light) of the photoelectric conversion layer 25 is set to be higher than the light absorption coefficient of the channel layer 25.

This ensures that, in the case of making the second element forming portion 22 function as a light sensor element, the number of electron-hole pairs generated by incidence of light on the photoelectric conversion layer 35 is increased. Therefore, a larger photoelectric current is obtained, as compared to the case where the photoelectric conversion layer is formed from the same material as that for the first element forming portion 21 and in the same thickness as that of the first element forming portion 21. Consequently, the sensitivity of the light sensor element can be enhanced, without influencing a thin film transistor Tr serving as a switching element for a pixel 11.

In addition, since the gate electrode 33 is formed as a metallic shielding electrode, light incident from a back-light (not shown) (the light will hereinafter be referred to as "back-light light") is shielded by the gate electrode 33. Therefore, incidence of the back-light light on the photoelectric conversion layer 35 can be prevented by the gate electrode 33. Besides, since silver forming the gate electrode 33 has a high reflectance, the light having externally entered and passed through the photoelectric conversion layer 35 is reflected by the gate electrode 33, and the thus reflected light again enters the photoelectric conversion layer 35 as return light. Accordingly, the sensitivity of the light sensor element is enhanced by the same principle as that in the above-described second embodiment.

In addition, in the liquid crystal display 1 according to the third embodiment, the whole body of the first element forming portions 21 arranged in the display area E1 transmits light. Therefore, it is possible to render the display area E1 transparent at non-driving times, and to display an image in the display area E1 at a driving time. Besides, although the gate electrode 33 in the second element forming portion 22 shields light and the photoelectric conversion layer 35 absorbs part of light, spoiling of the transparency of the display panel can be obviated by a configuration in which the second element forming portions 22 provided in the plane of the display panel are arranged at inconspicuous end positions in the peripheral area E2 (for example, at the four corners of the display panel).

Figure 13:
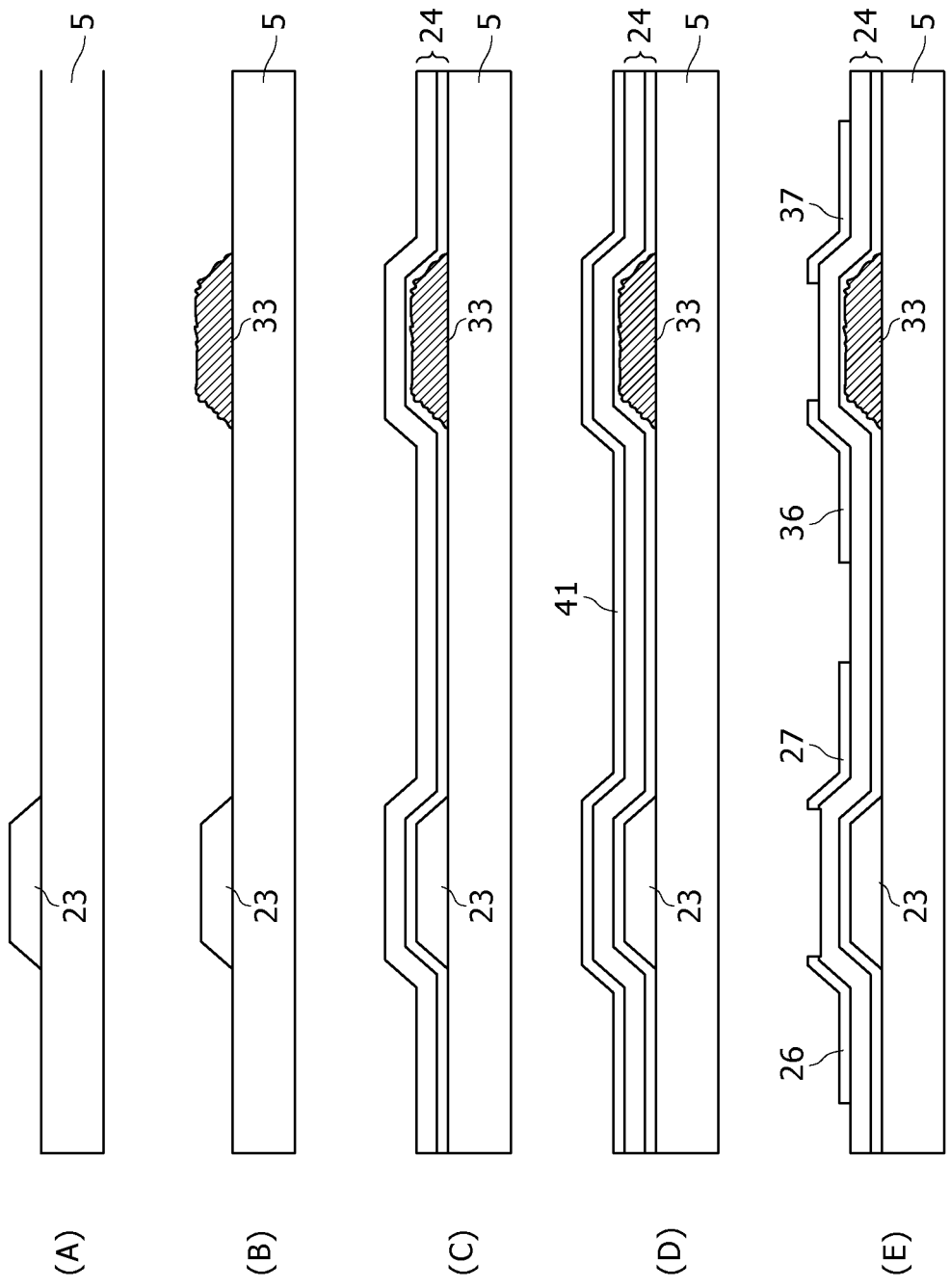
FIG. 13 shows views (No. 1) illustrating a method for manufacturing the liquid crystal display according to the third embodiment of the invention.
Figure 14:
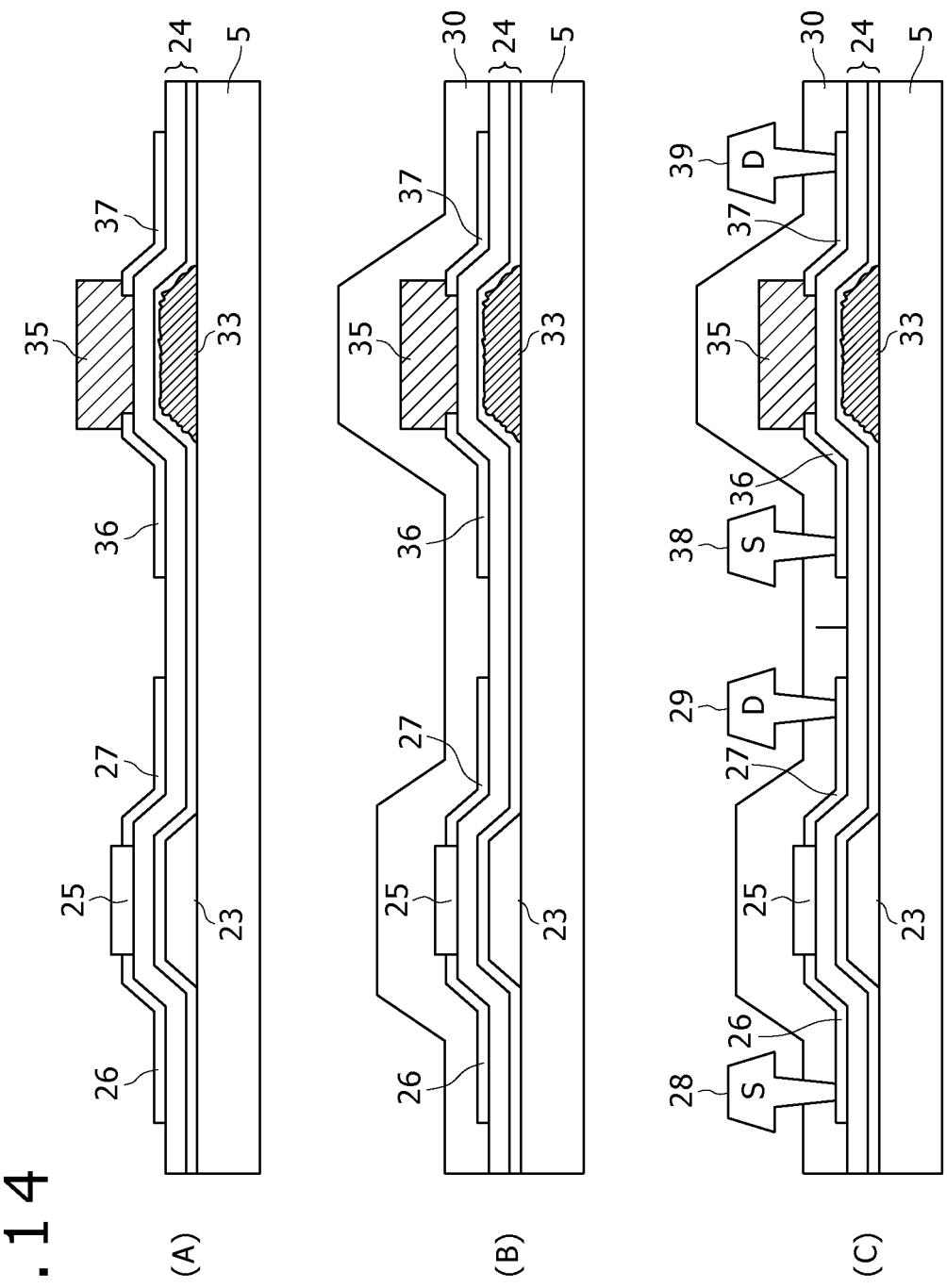
FIG. 14 shows views (No. 2) illustrating the method for manufacturing the liquid crystal display according to the third embodiment of the invention.

FIGS. 13 and 14 show views illustrating a method for manufacturing the liquid crystal display according to the third embodiment of the present invention. First, as shown in (A) of FIG. 13, a transparent gate electrode 23 is formed over a glass substrate 5 to be provided with the above-mentioned plurality of pixels 11 in a matrix pattern.

Next, as shown in (B) of FIG. 13, a gate electrode 33 having a light-shielding property is formed over the glass substrate 5. The gate electrode 33 is formed, for example, by an ink jet film forming method in which silver is used as a film forming material.

Subsequently, as shown in (C) of FIG. 13, a silicon nitride film and a silicon oxide film are sequentially formed over the glass substrate 5 in the state of covering the gate electrodes 23 and 33 by, for example, a PECVD method, a sputtering method, a coating method or the like, to form a gate insulating film 24.

Next, as shown in (D) of FIG. 13, a transparent conductive film 41 is formed over the glass substrate 5 in the state of covering the gate insulating film 24 by a sputtering method, a coating method or the like. The transparent conductive film 41 is formed over the glass substrate 5 so as to range over a first element forming portion 21 and a second element forming portion 22.

Subsequently, as shown in (E) of FIG. 13, the transparent conductive film 41 is separated into island-like shapes by wet etching or dry etching in parts which correspond to the first element forming portion 21 and the second element forming portion 22, whereby a source 26 and a drain 27 are formed on the side of the gate electrode 23 included in the first element forming portion 21, while a source 36 and a drain 37 are formed on the side of the gate electrode 33 included in the second element forming portion 22. In addition, on the upper side of the gate electrode 23, the transparent conductive film 41 present in a part corresponding to an active layer (channel layer) is removed, thereby exposing a surface of the gate insulating film 24 between the source 26 and the drain 27. Similarly, on the upper side of the gate electrode 33, the transparent conductive film 41 present in a part corresponding to an active layer (photoelectric conversion layer) is removed, thereby exposing a surface of the gate insulating film 24 between the source 36 and the drain 37.

Next, as shown in (A) of FIG. 14, in that part on the upper side of the gate electrode 23 at which the transparent conductive film 41 has been removed, a channel layer 25 including a transparent semiconductor film is formed by, for example, a PECVD method, a sputtering method, an evaporation method, a coating method or the like. The transparent semiconductor film is formed, for example, by use of a transparent oxide semiconductor or an organic semiconductor. Besides, before or after this step, a photoelectric conversion layer 35 is formed in that part on the upper side of the gate electrode 33 at which the transparent conductive film 41 has been removed, by a selective film forming method, for example, a printing method such as an ink jet film forming method, etc., a photo CVD method such as laser CVD, etc., a stamping method, or the like. The photoelectric conversion layer 35 is formed by an opaque semiconductor film (for example, silicon film) in order to obtain a light-absorbing action. In the ink jet film forming method and the photo CVD method, the film thickness can be controlled arbitrarily. Here, therefore, the photoelectric conversion layer 35 is formed to be larger in film thickness than the channel layer 25.

Subsequently, as shown in (B) of FIG. 14, an inter-layer insulating film 30 is formed over the glass substrate 5 in the state of covering the channel layer 25, the source 26 and the drain 27 and also covering the photoelectric conversion layer 35, the source 36 and the drain 37.

Next, as shown in (C) of FIG. 14, a contact hole reaching the source 26 and a contact hole reaching the drain 27 are formed respectively on both sides of the channel layer 25, and a source electrode 28 and a drain electrode 29 are formed in the inter-layer insulating film 30 in the state of filling up the contact holes with a wiring material. Besides, concurrently with this, a contact hole reaching the source 36 and a contact hole reaching the drain 37 are formed respectively on both sides of the photoelectric conversion layer 35, and a source electrode 38 and a drain electrode 39 are formed in the state of filling up the contact holes with a wiring material.

By the manufacturing method as above, the switching elements (thin film transistors) each including the channel layer 25 and the light sensor elements each including the photoelectric conversion layer 35 can be formed over the same glass substrate 5. In addition, the channel layer 25 constituting the switching element (thin film transistor) for the pixel in the first element forming portion 21 and the photoelectric conversion layer 35 constituting the light sensor element in the second element forming portion 22 can be formed from different materials and in different thicknesses.

Therefore, the material for forming the photoelectric conversion layer 35 can be selected arbitrarily. Besides, the channel layer 25 constituting the switching element for the pixel can be formed by a transparent semiconductor film which transmits light therethrough, and the photoelectric conversion layer 35 constituting the light sensor element can be formed by an opaque semiconductor film which absorbs light. Furthermore, in the second element forming portion 22, the gate electrode 33 can be formed which has both the function of shielding the back-light light to prevent the back-light light from entering the photoelectric conversion layer 35 and the function of reflecting external light to return the external light into the photoelectric conversion layer 35.

Fourth Embodiment

Figure 15:
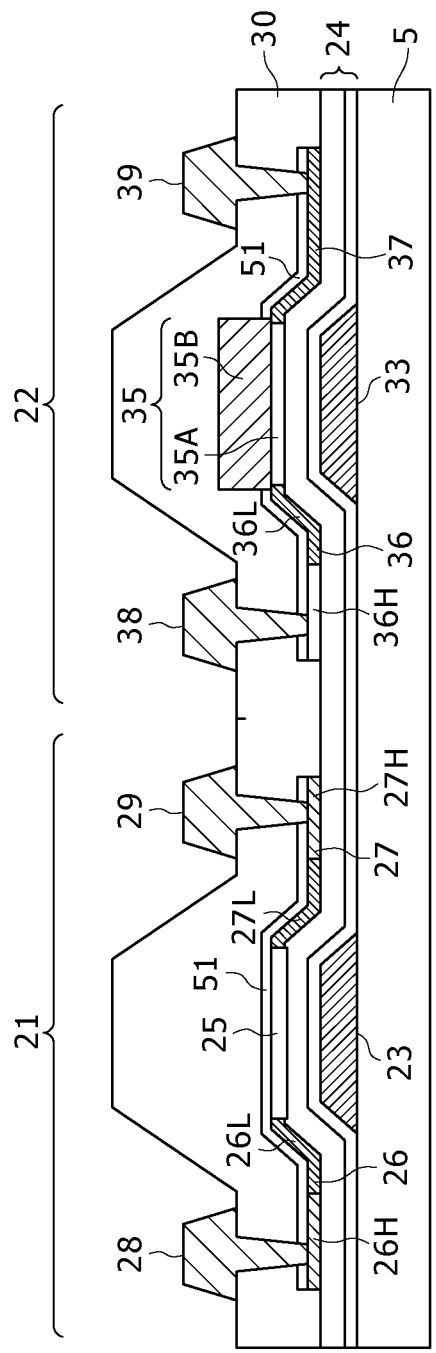
FIG. 15 is a sectional view showing a main part of a driving substrate in a liquid crystal display according to a fourth embodiment of the invention.

FIG. 15 is a sectional view showing a main part of a driving substrate 2 in a liquid crystal display 1 according to a fourth embodiment of the present invention. The fourth embodiment differs from the above-described first embodiment, particularly in the configuration of the second element forming portion 22. Specifically, in the second element forming portion 22, a photoelectric conversion layer 35 has a two-layer stacked structure including a first layer 35A and a second layer 35B stacked thereon. The first layer 35A and the second layer 35B are formed by use of the same element (in this embodiment, silicon). While the photoelectric conversion layer 35 here has the two-layer stacked structure as an example, this configuration is not limitative, and the photoelectric conversion layer 35 may have a stacked structure including three or more layers. The number of layers stacked to form the photoelectric conversion layer 35 is determined by the number of the film-forming steps. Therefore, for example, where the photoelectric conversion layer 35 is formed by two film-forming steps, the number of layers stacked to form the photoelectric conversion layer 35 is two. In a first element forming portion 21, a mask layer 51 is formed in the state of covering a channel layer 25 and the source/drain 26, 27; in a second element forming portion 22, similarly, a mask layer 51 is formed in the state of covering the source/drain 36, 37. The mask 51 is formed for making the photoelectric conversion layer 35 have a stacked structure in the manufacturing method which will be described later. Further, in the second element forming portion 22, the source 36 has an LDD structure including a high-concentration impurity region 36H and a low-concentration impurity region 36L, while the drain 37 is formed as a $p^+$-type impurity diffusion region.

Figure 16:
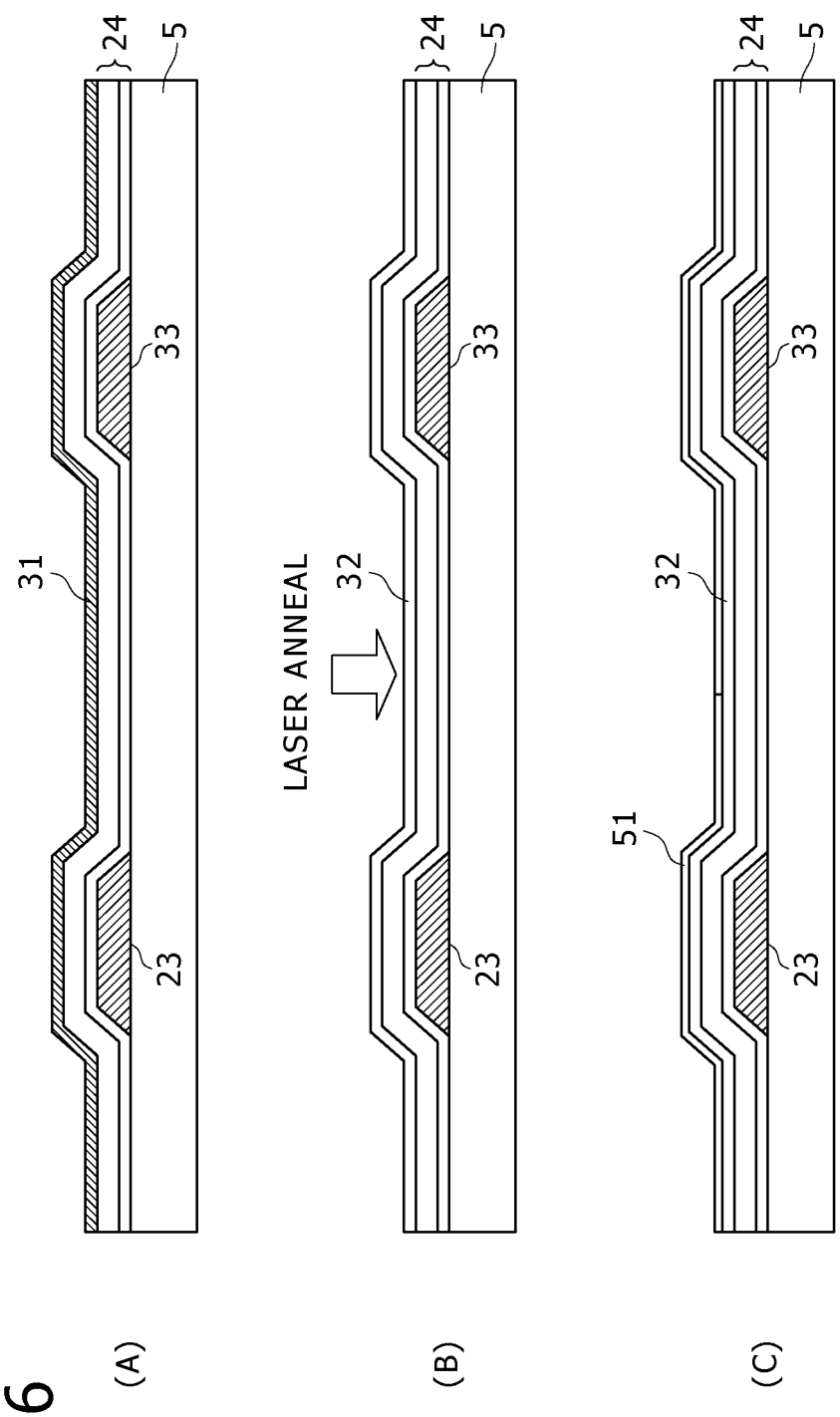
FIG. 16 shows views (No. 1) illustrating a method for manufacturing the liquid crystal display according to the fourth embodiment of the invention.
Figure 17:
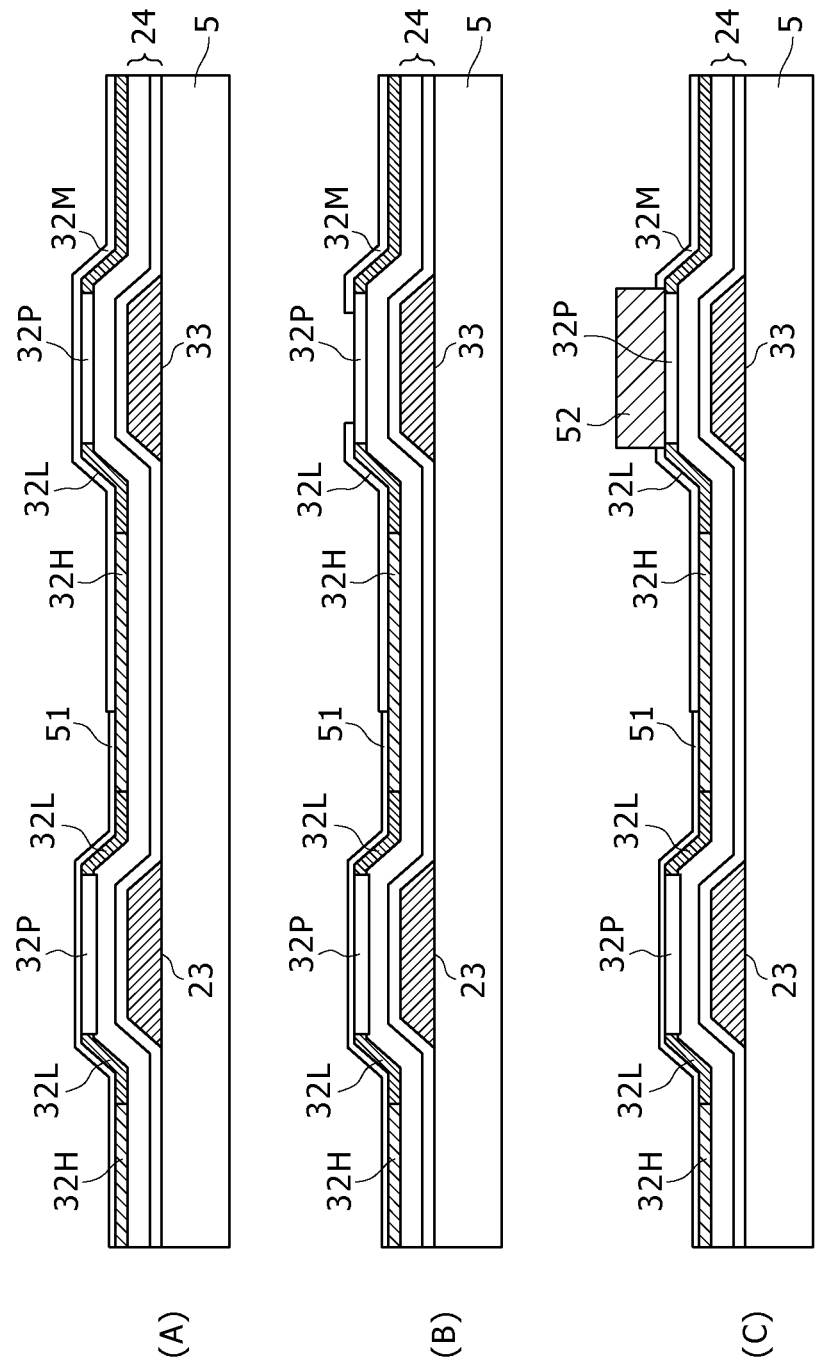
FIG. 17 shows views (No. 2) illustrating the method for manufacturing the liquid crystal display according to the fourth embodiment of the invention.
Figure 18:
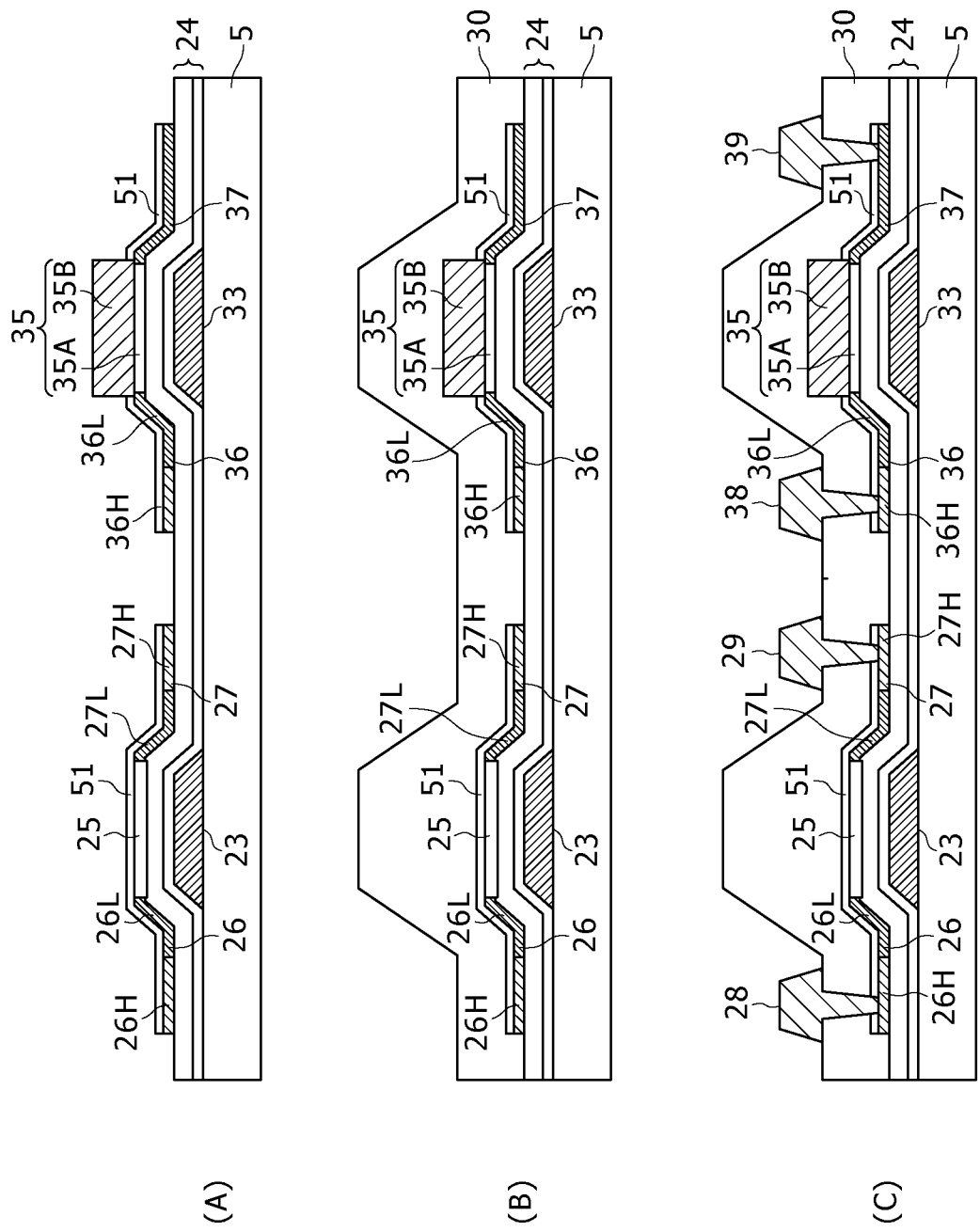
FIG. 18 shows views (No. 3) illustrating the method for manufacturing the liquid crystal display according to the fourth embodiment of the invention.

FIGS. 16 to 18 show views illustrating a method for manufacturing the liquid crystal display according to the fourth embodiment of the present invention. First, as shown in (A) of FIG. 16, gate electrodes 23, 33 and a gate insulating film 24 are formed over a glass substrate 5 to be provided with the above-mentioned plurality of pixels 11 in a matrix pattern, and thereafter a semiconductor film 31 including amorphous silicon is formed in the state of covering the gate insulating film 24. The gate insulating film 24 is formed by sequentially forming a silicon nitride film and a silicon oxide film over the glass substrate 5 by, for example, a PECV (plasma enhanced chemical vapor deposition) method or the like. The semiconductor film 31, which corresponds to the "first semiconductor film," is formed over the glass substrate 5 so as to range over the first element forming portion 21 and the second element forming portion.

Next, as shown in (B) of FIG. 16, the amorphous semiconductor film 31 is polycrystallized by laser anneal, whereby a semiconductor film 32 including polycrystalline silicon is obtained. At this stage, the polycrystalline semiconductor film 32 has been formed over the glass substrate 5.

Subsequently, as shown in (C) of FIG. 16, a mask layer 51 is formed over the glass substrate 5 in the state of covering the semiconductor film 32. The mask layer 51 is formed by a silicon oxide film, for example. The mask layer 51 thus provided can protect the semiconductor layer from a photoresist and water in the subsequent steps, and ions can be implanted through the mask layer 51 by controlling an ion acceleration voltage.

Next, as shown in (A) of FIG. 17, an impurity or impurities are introduced into the polycrystalline semiconductor film 32 respectively in a region on the upper side of the gate electrode 23, exclusive of a polycrystalline silicon portion for constituting the channel layer 25, and in a region on the upper side of the gate electrode 33, exclusive of a polycrystalline silicon portion for constituting the photoelectric conversion layer 35. The introduction of the impurity (impurities) is conducted by, for example, ion doping, ion implantation, plasma implantation or the like. This results in that, in the first element forming portion 21, the semiconductor film 32 is partitioned into a polycrystalline silicon region 32P, an $n^+$-type high-concentration impurity region 32H, and $n^+$-type low-concentration impurity regions 32L. Besides, in the second element forming portion 22, the semiconductor film 32 is partitioned into a polycrystalline silicon region 32P, an $n^+$-type high-concentration impurity region 32H, an $n^+$-type low-concentration impurity region 32L, and a $p^+$-type high-concentration impurity region 32M.

Subsequently, as shown in (B) of FIG. 17, in the second element forming portion 22, the mask layer 51 is partially removed, to expose a surface (upper surface) of the polycrystalline silicon region 32P. The removal of the mask layer 51 is carried out by etching, for example.

Next, as shown in (C) of FIG. 17, in the second element forming portion 22, a semiconductor film 52 is formed in the part where the mask layer 51 has been removed, by use of the same element (in this embodiment, silicon) as that used for the polycrystalline silicon region 32P. The semiconductor film 52, which corresponds to the "second semiconductor film," is formed by using, for example, polycrystalline silicon, amorphous silicon, nano-silicon having a crystal grain diameter on the nano order, μ-silicon having a crystal grain diameter on the micro order, or the like. The formation of the semiconductor film 52 is carried out by, for example, a thermal CVD method, a reactive thermal CVD method, a PECVD method, a reactive PECVD method, a sputtering method, a photo CVD method, a PLD (pulse laser deposition) method, a melt printing method or the like. In this case, the silicon film to be the semiconductor film 52 is selectively grown on that surface of the polycrystalline silicon region 32P which is exposed due to the removal of the mask layer 51 therefrom. Therefore, on the polycrystalline silicon region 32P formed of silicon, the semiconductor film 52 is formed from the same silicon. Accordingly, the silicon film constituting the semiconductor film 52 is grown while the underlying polycrystalline silicon constituting the polycrystalline silicon region 32P serves as nuclei. This ensures that the film growth rate can be enhanced, as compared to the case where the silicon film is formed by a thermal CVD method or the like in the absence of polycrystalline silicon serving as nuclei. In addition, by controlling process conditions and the like as required, it is possible to form a crystalline silicon film (microcrystalline silicon film) of good quality, without performing laser anneal or the like.

Incidentally, before forming the semiconductor film 52, a treatment in which a natural oxide film on the surface of the polycrystalline silicon region 32P is removed by an oxidizing treatment and thereafter a film of catalysts such as nickel and gold is formed in such a small thickness as to permit transmission of light therethrough may be conducted in order to enhance crystal.

Subsequently, as shown in (A) of FIG. 18, in areas corresponding to the first element forming portion 21 and the second element forming portion 22, the semiconductor film 32 and the mask layer 51 covering it are separated into island-like shapes by wet etching or dry etching. This results in that a channel layer 25 is formed in the first element forming portion 21, and a photoelectric conversion layer 35 is formed in the second element forming portion 22. In addition, a source 26 and a drain 27 are formed on the side of the gate electrode 23 included in the first element forming portion 21, and a source 36 and a drain 37 are formed on the side of the gate electrode 33 included in the second element forming portion 22. In this instance, in the first element forming portion 21, the polycrystalline silicon region 32P forms the channel layer 25. On the other hand, in the second element forming portion 22, the polycrystalline silicon region 32P and the semiconductor film 52 respectively form a first layer 35A and a second layer 35B, and the stacked portion of them forms the photoelectric conversion layer 35. In addition, in the first element forming portion 21, the source 26 is partitioned into a high-concentration impurity region 26H and a low-concentration impurity region 26L of the $n^+$-type, and the drain 27 is also partitioned into a high-concentration impurity region 27H and a low-concentration impurity region 27L of the $n^+$-type. Besides, in the second element forming portion 22, the source 36 is partitioned into a high-concentration impurity region 36H and a low-concentration impurity region 36L of the $n^+$-type, and the drain 37 forms a high-concentration impurity region of the $p^+$-type.

Next, as shown in (B) of FIG. 18, an inter-layer insulating film 30 is formed over the glass substrate 5 in the state of covering the channel layer 25, the source 26 and the drain 27 and also covering the photoelectric conversion layer 35, the source 36 and the drain 37.

Subsequently, as shown in (C) of FIG. 18, a contact hole reaching the high-concentration impurity region 26H of the source 26 and a contact hole reaching the high-concentration impurity region 27H of the drain 27 are formed respectively on both sides of the channel layer 25. Then, a source electrode 28 and a drain electrode 29 are formed in the inter-layer insulating film 30 in the state of filling up these contact holes with a wiring material. Besides, concurrently with this, a contact hole reaching the high-concentration impurity region 36H of the source 36 and a contact hole reaching the drain 37 are formed respectively on both sides of the photoelectric conversion layer 35. Then, a source electrode 38 and a drain electrode 39 are formed in the state of filling up these contact holes with a wiring material.

By the manufacturing method as above, a switching element (thin film transistor) including the channel layer 25 and a light sensor element including the photoelectric conversion layer 35 can be formed over the same glass substrate 5. In addition, the photoelectric conversion layer 35 of the light sensor element can be formed to have a stacked structure of the first layer 35A and the second layer 35B both of which include silicon as the same element. Besides, the first layer 35A of the photoelectric conversion layer 35 is a layer formed by the same step as that for forming the channel layer 25; in other words, the first layer 35A is a layer having the same thickness as that of the channel layer 25. This ensures that, by stacking the second layer 35B over the first layer 35A, the photoelectric conversion layer 35 can be formed to be thicker than the channel layer 25.

Incidentally, while the source 36 in the second element forming portion 22 has had the LDD structure and the drain 37 has been the high-concentration impurity region of the $p^+$-type in the fourth embodiment described above, this configuration is not limitative, and a configuration may be adopted in which the source 36 is a high-concentration impurity region of the $p^+$-type and the drain 37 has the LDD structure.

Fifth Embodiment

Figure 19:
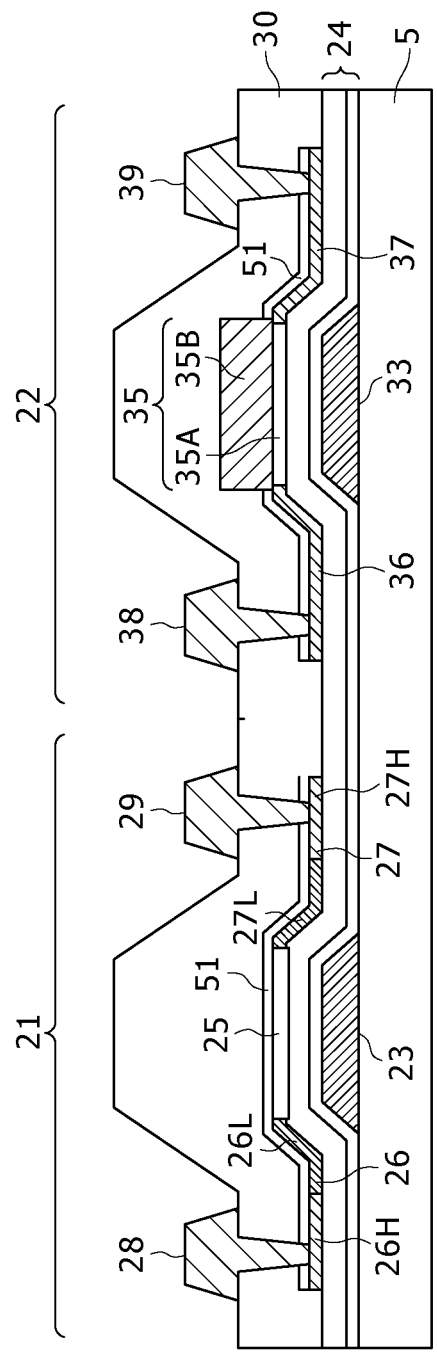
FIG. 19 is a sectional view showing a main part of a driving substrate in a liquid crystal display according to a fifth embodiment of the invention.

FIG. 19 is a sectional view showing a main part of a driving substrate 2 in a liquid crystal display 1 according to a fifth embodiment of the present invention. The fifth embodiment differs from the above-described fourth embodiment, particularly in that the source 36 in the second element forming portion 22 does not have the LDD structure but is a $p^+$-type impurity diffusion region.

Figure 20:
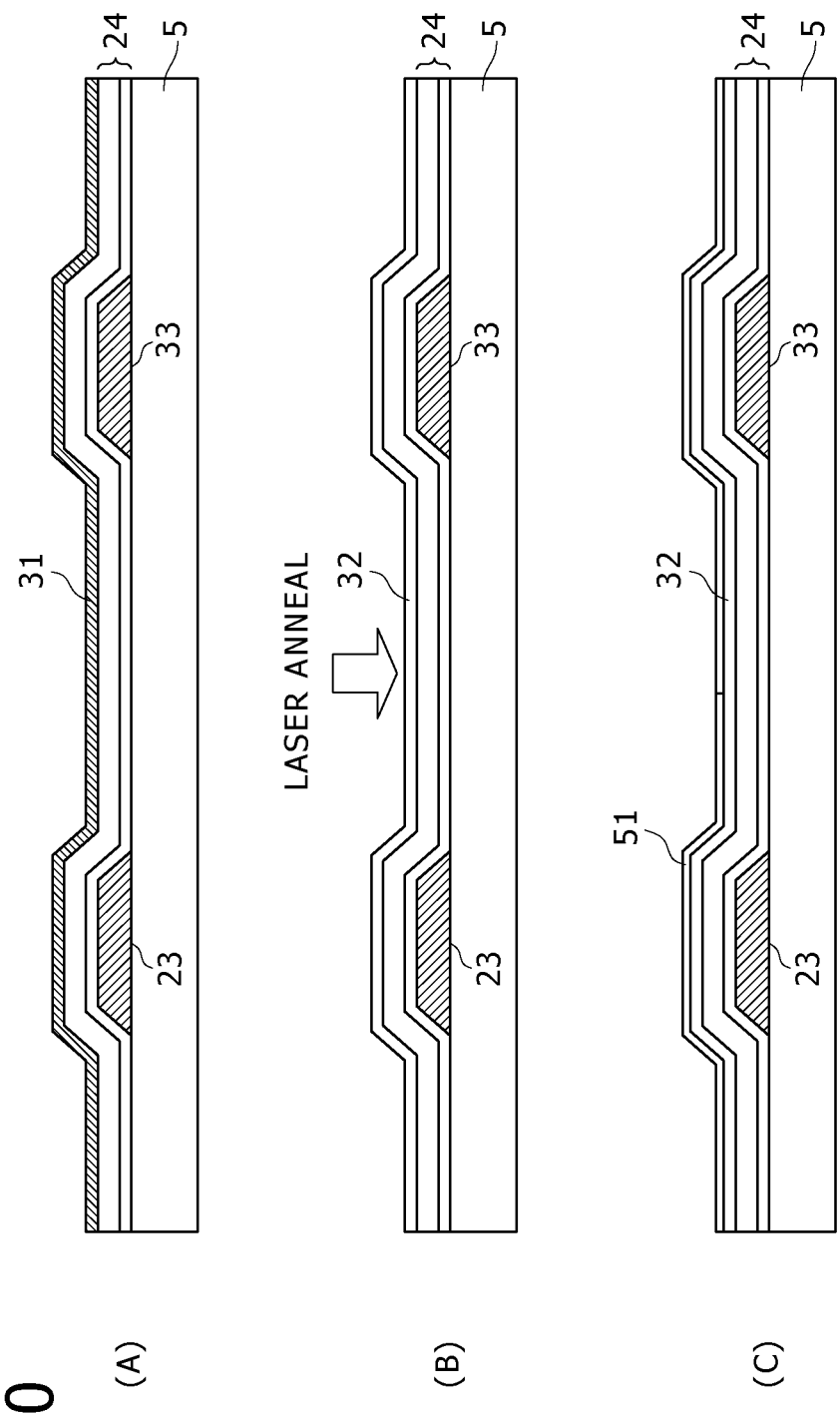
FIG. 20 shows views (No. 1) illustrating a method for manufacturing the liquid crystal display according to the fifth embodiment of the invention.
Figure 21:
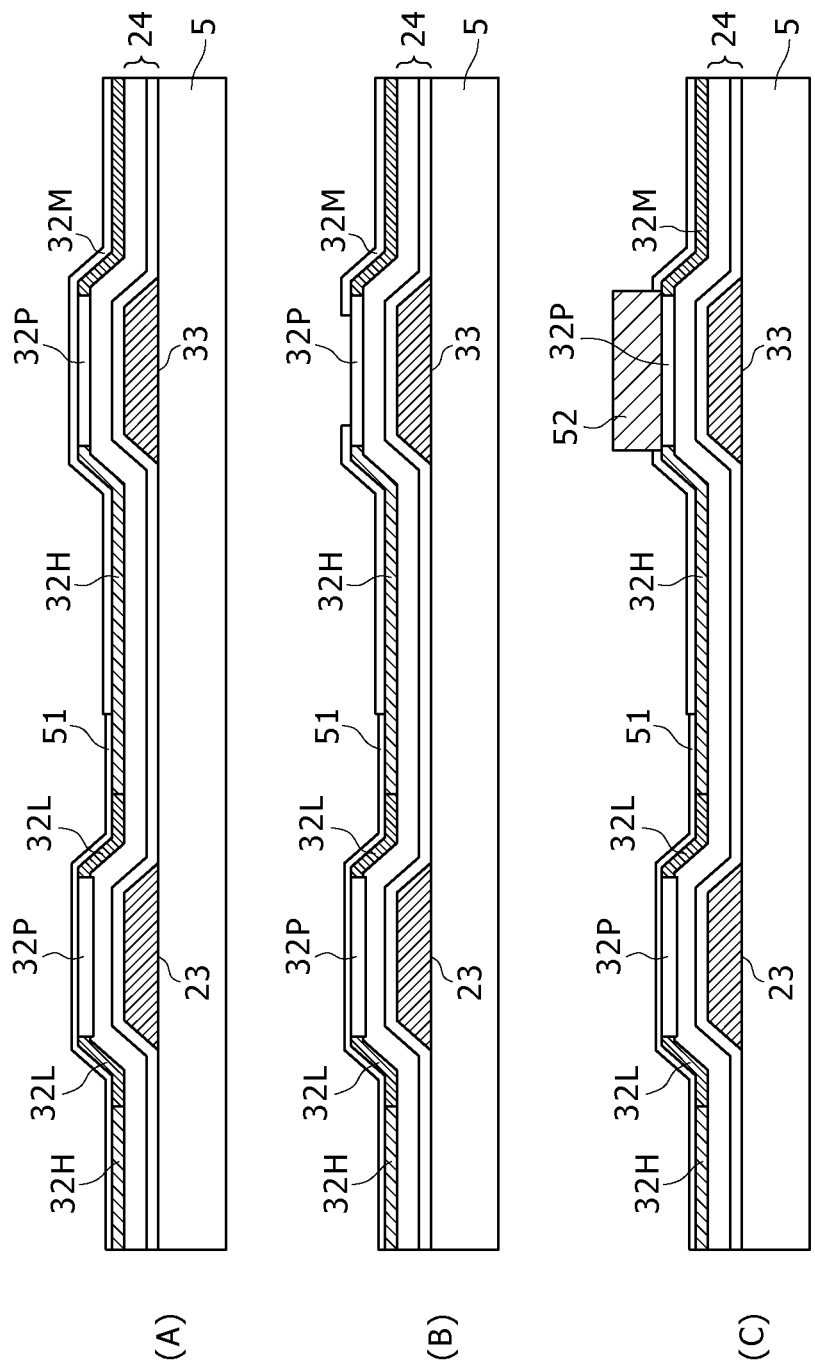
FIG. 21 shows views (No. 2) illustrating the method for manufacturing the liquid crystal display according to the fifth embodiment of the invention.
Figure 22:
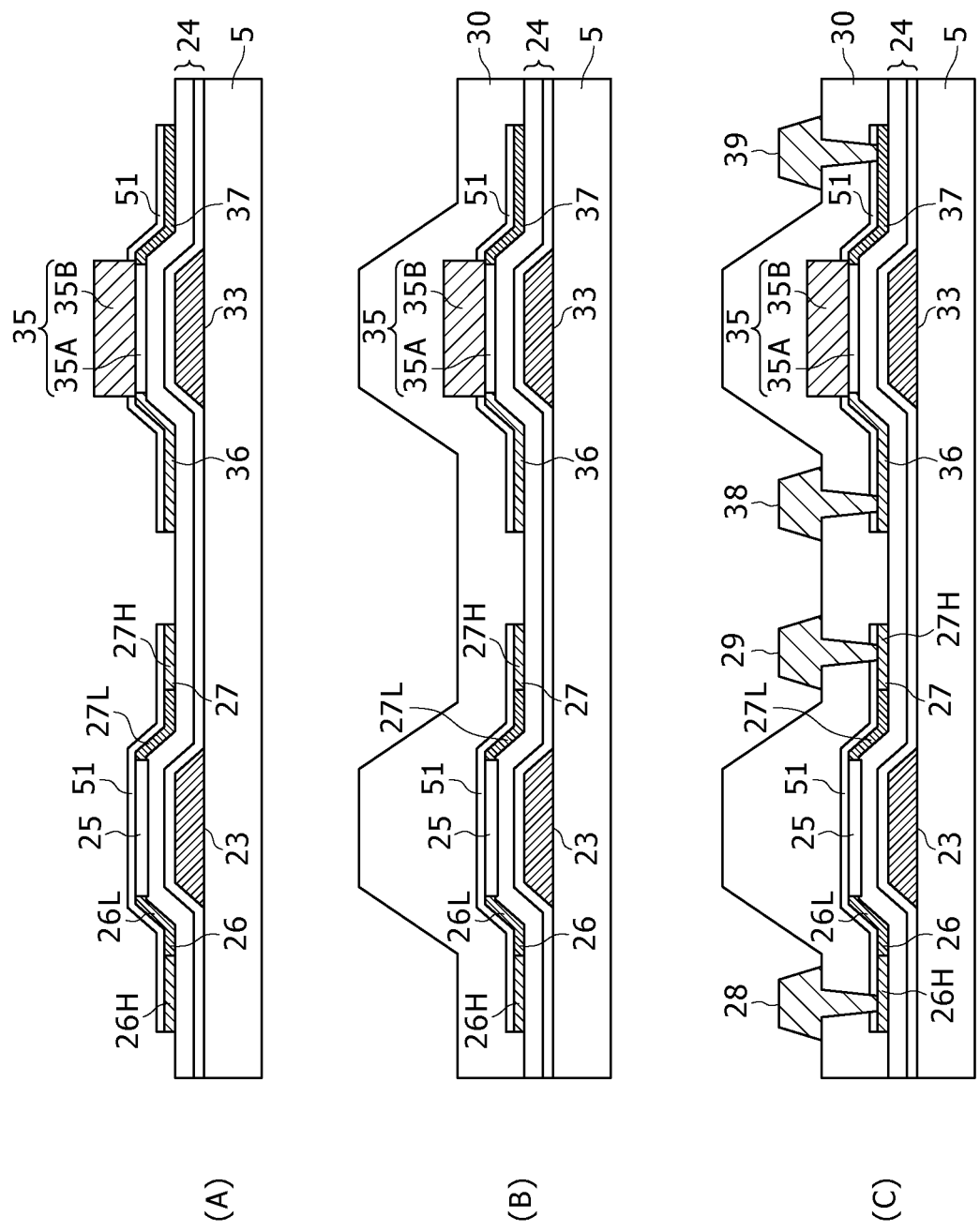
FIG. 22 shows views (No. 3) illustrating the method for manufacturing the liquid crystal display according to the fifth embodiment of the invention.

FIGS. 20 to 22 show views illustrating a method for manufacturing the liquid crystal display according to the fifth embodiment of the present invention. First, as shown in (A) of FIG. 20, gate electrodes 23, 33 and a gate insulating film 24 are formed over a glass substrate 5 to be provided with the above-mentioned plurality of pixels 11 in a matrix pattern, and thereafter a semiconductor film 31 of amorphous silicon is formed in the state of covering the gate insulating film 24. The semiconductor film 31 is formed over the glass substrate 5 so as to range over the first element forming portion 21 and the second element forming portion 22.

Next, as shown in (B) of FIG. 20, the amorphous semiconductor film 31 is polycrystallized by laser anneal, to obtain a semiconductor film 32 of polycrystalline silicon.

Subsequently, as shown in (C) of FIG. 20, a mask layer 51 is formed over the glass substrate 5 in the state of covering the semiconductor film 32. The steps up to this point are the same as in the case of the fourth embodiment above.

Next, as shown in (A) of FIG. 21, an impurity or impurities are introduced into the polycrystalline semiconductor film 32 respectively in a region on the upper side of the gate electrode 23, exclusive of a polycrystalline silicon portion for constituting a channel layer 25, and in a region on the upper side of the gate electrode 33, exclusive of a polycrystalline silicon portion for constituting a photoelectric conversion layer 35. The introduction of the impurity (impurities) is carried out by, for example, ion doping, ion implantation, plasma implantation or the like. This results in that, in the first element forming portion 21, the semiconductor film 32 is partitioned into a polycrystalline silicon region 32P, an $n^+$-type high-concentration impurity region 32H, and an $n^+$-type low-concentration impurity region 32L. Besides, in the second element forming portion 22, the semiconductor film 32 is partitioned into a polycrystalline silicon region 32P, an $n^+$-type high-concentration impurity region 32H, and a $p^+$-type high-concentration impurity region 32M.

Subsequently, as shown in (B) of FIG. 21, in the second element forming portion 22, the mask layer 51 is partially removed, to expose a surface (upper surface) of the polycrystalline silicon region 32P.

Next, as shown in (C) of FIG. 21, in the second element forming portion 22, a semiconductor film 52 is formed in the part where the mask layer 51 has been removed, by use of the same element (in this embodiment, silicon) as that used for forming the polycrystalline silicon region 32P. The technique for forming the semiconductor film 52 is the same as in the case of the fourth embodiment above.

Subsequently, as shown in (A) of FIG. 22, in parts which correspond to the first element forming portion 21 and the second element forming portion 22, the semiconductor film 32 and the mask layer 51 covering it are separated into island-like shapes by wet etching or dry etching. By this, a channel layer 25 is formed in the first element forming portion 21, and a photoelectric conversion layer 35 is formed in the second element forming portion 22. In addition, a source 26 and a drain 27 are formed on the side of the gate electrode 23 included in the first element forming portion 21, and a source 36 and a drain 37 are formed on the side of the gate electrode 33 included in the second element forming portion 22. In this instance, in the first element forming portion 21, the polycrystalline silicon region 32P forms the channel layer 25. In the second element forming portion 22, the polycrystalline silicon region 32P and the semiconductor film 52 respectively form a first layer 35A and a second layer 35B, and a stacked portion of them forms the photoelectric conversion layer 35. In addition, in the first element forming portion 21, the source 26 is partitioned into a high-concentration impurity region 26H and a low-concentration impurity region 26L of the $n^+$-type, and the drain 27 is also partitioned into a high-concentration impurity region 27H and a low-concentration impurity region 27L of the $n^+$-type. Besides, in the second element forming portion 22, the source 36 forms a high-concentration impurity region of the $n^+$-type, and the drain 37 forms a high-concentration impurity region of the $p^+$-type.

Next, as shown in (B) of FIG. 22, an inter-layer insulating film 30 is formed over the glass substrate 5 in the state of covering the channel layer 25, the source 26 and the drain 27 and also covering the photoelectric conversion layer 35, the source 36 and the drain 37.

Subsequently, as shown in (C) of FIG. 22, a contact hole reaching the high-concentration impurity region 26H of the source 26 and a contact hole reaching the high-concentration impurity region 27H of the drain 27 are formed respectively on both sides of the channel layer 25. Then, a source electrode 28 and a drain electrode 29 are formed in the inter-layer insulating film 30 in the state of filling up these contact holes with a wiring material. Besides, concurrently with this, a contact hole reaching the source 36 and a contact hole reaching the drain 37 are formed respectively on both sides of the photoelectric conversion layer 35. Then, a source electrode 38 and a drain electrode 39 are formed in the state of filling up these contact holes with a wiring material.

By the manufacturing method as above, a driving substrate 2 configured as shown in FIG. 19 is obtained. Incidentally, while the source 36 in the second element forming portion 22 has been the high-concentration impurity region of the $n^+$-type and the drain 37 has been the high-concentration impurity region of the $p^+$-type in the fifth embodiment, this configuration is not limitative, and a configuration may be adopted in which the source 36 is a high-concentration impurity region of the $p^+$-type and the drain 37 is a high-concentration impurity region of the $n^+$-type.

Sixth Embodiment

Figure 23:
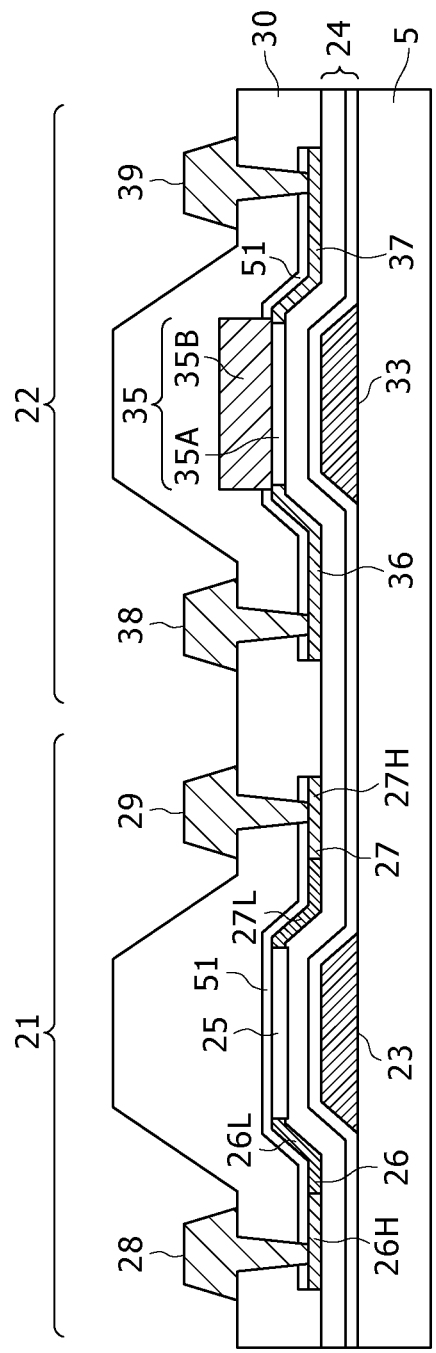
FIG. 23 is a sectional view showing a main part of a driving substrate in a liquid crystal display according to a sixth embodiment of the invention.

FIG. 23 is a sectional view showing a main part of a driving substrate 2 in a liquid crystal display 1 according to a sixth embodiment of the present invention. The sixth embodiment differs from the above-described fifth embodiment, particularly in that the source/drain 36, 37 in the second element forming portion 22 are both n+-type impurity diffusion regions.

Figure 24:
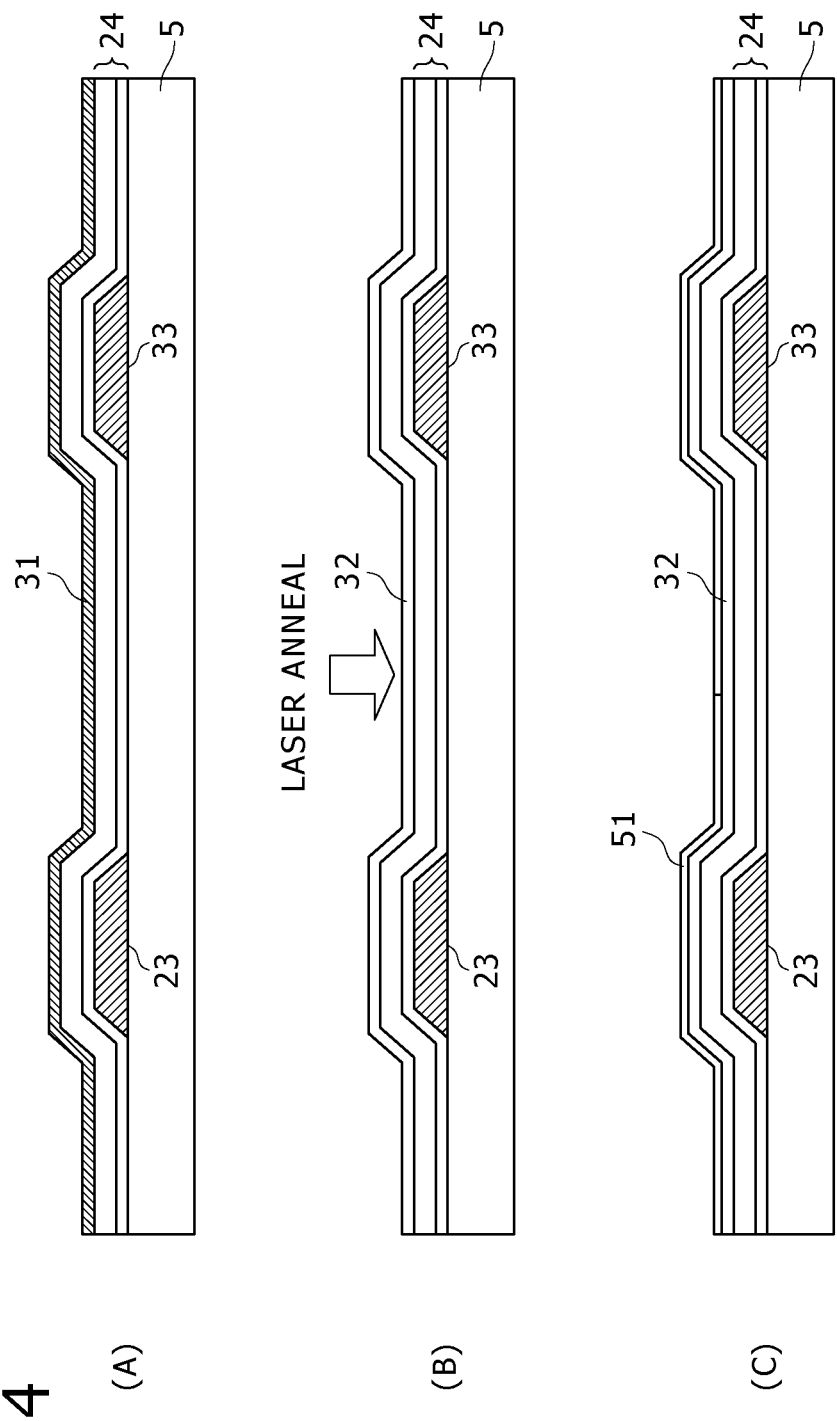
FIG. 24 shows views (No. 1) illustrating a method for manufacturing the liquid crystal display according to the sixth embodiment of the invention.
Figure 25:
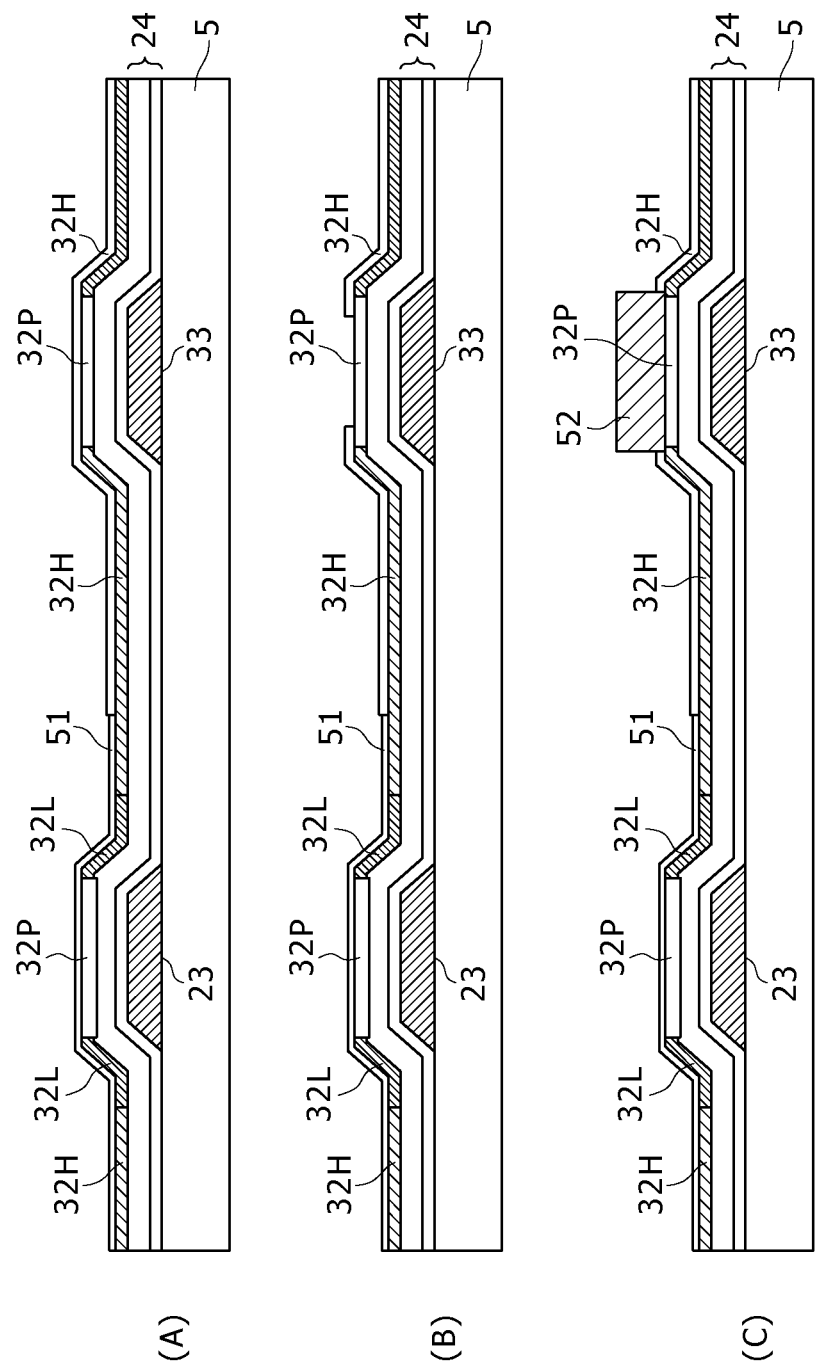
FIG. 25 shows views (No. 2) illustrating the method for manufacturing the liquid crystal display according to the sixth embodiment of the invention.

FIGS. 24 and 25 show views illustrating a method for manufacturing the liquid crystal display according to the first embodiment of the present invention. First, as shown in (A) of FIG. 24, gate electrodes 23, 33 and a gate insulating film 24 are formed over a glass substrate 5 to be provided with the above-mentioned plurality of pixels 11 in a matrix pattern, and thereafter a semiconductor film 31 of amorphous silicon is formed in the state of covering the gate insulating film 24. The semiconductor film 31 is formed over the glass substrate 5 so as to range over the first element forming portion 21 and the second element forming portion 22.

Next, as shown in (B) of FIG. 24, the amorphous semiconductor film 31 is polycrystallized by laser anneal, to obtain a semiconductor film 32 of polycrystalline silicon.

Subsequently, as shown in (C) of FIG. 24, a mask layer 51 is formed over the glass substrate 5 in the state of covering the semiconductor film 32. The steps up to this point are the same as in the case of the fourth embodiment above.

Next, as shown in (A) of FIG. 25, an impurity or impurities are introduced into the polycrystalline semiconductor film 32 respectively in a region on the upper side of the gate electrode 23, exclusive of a polycrystalline silicon portion for constituting a channel layer 25, and in a region on the upper side of the gate electrode 33, exclusive of a polycrystalline silicon portion for constituting a photoelectric conversion layer 35. The introduction of the impurity (impurities) is carried out by, for example, ion doping, ion implantation, plasma implantation or the like. This results in that, in the first element forming portion 21, the semiconductor film 32 is partitioned into a polycrystalline silicon region 32P, an $n^+$-type high-concentration impurity region 32H, and an $n^+$-type low-concentration impurity region 32L. Besides, in the second element forming portion 22, the semiconductor film 32 is partitioned into a polycrystalline silicon region 32P, and an $n^+$-type high-concentration impurity region 32H.

Subsequently, as shown in (B) of FIG. 25, in the second element forming portion 22, the mask layer 51 is partially removed, to expose a surface (upper surface) of the polycrystalline silicon region 32P.

Next, as shown in (C) of FIG. 25, in the second element forming portion, a semiconductor film 52 is formed in the part where the mask layer 51 has been removed, by use of the same element (in this embodiment, silicon element) as that used for forming the polycrystalline silicon region 32P. The technique for forming the semiconductor film 52 is the same as in the case of the fourth embodiment above.

Subsequently, as shown in (A) of FIG. 26, in parts which correspond to the first element forming portion 21 and the second element forming portion 22, the semiconductor film 32 and the mask layer 51 covering it are separated into island-like shapes by wet etching or dry etching. By this, a channel layer 25 is formed in the first element forming portion 21, and a photoelectric conversion layer 35 is formed in the second element forming portion 22. Besides, a source 26 and a drain 27 are formed on the side of the gate electrode 23 included in the first element forming portion 21, and a source 36 and a drain 37 are formed on the side of the gate electrode 33 included in the second element forming portion 22. In this case, in the first element forming portion 21, the polycrystalline region 32P forms the channel layer 25. In the second element forming portion 22, the polycrystalline silicon region 32P and the semiconductor film 52 respectively form a first layer 35A and a second layer 35B, and a stacked portion of them forms the photoelectric conversion layer 35. In addition, in the first element forming portion 21, the source 26 is partitioned into a high-concentration impurity region 26H and a low-concentration impurity region 26L of the $n^+$-type, and the drain 27 is similarly partitioned into a high-concentration impurity region 27H and a low-concentration impurity region 27L of the $n^+$-type. Besides, in the second element forming portion 22, the source 36 forms a high-concentration impurity region of the $n^+$-type, and the drain 37 also forms a high-concentration impurity region of the $n^+$-type.

Figure 26:
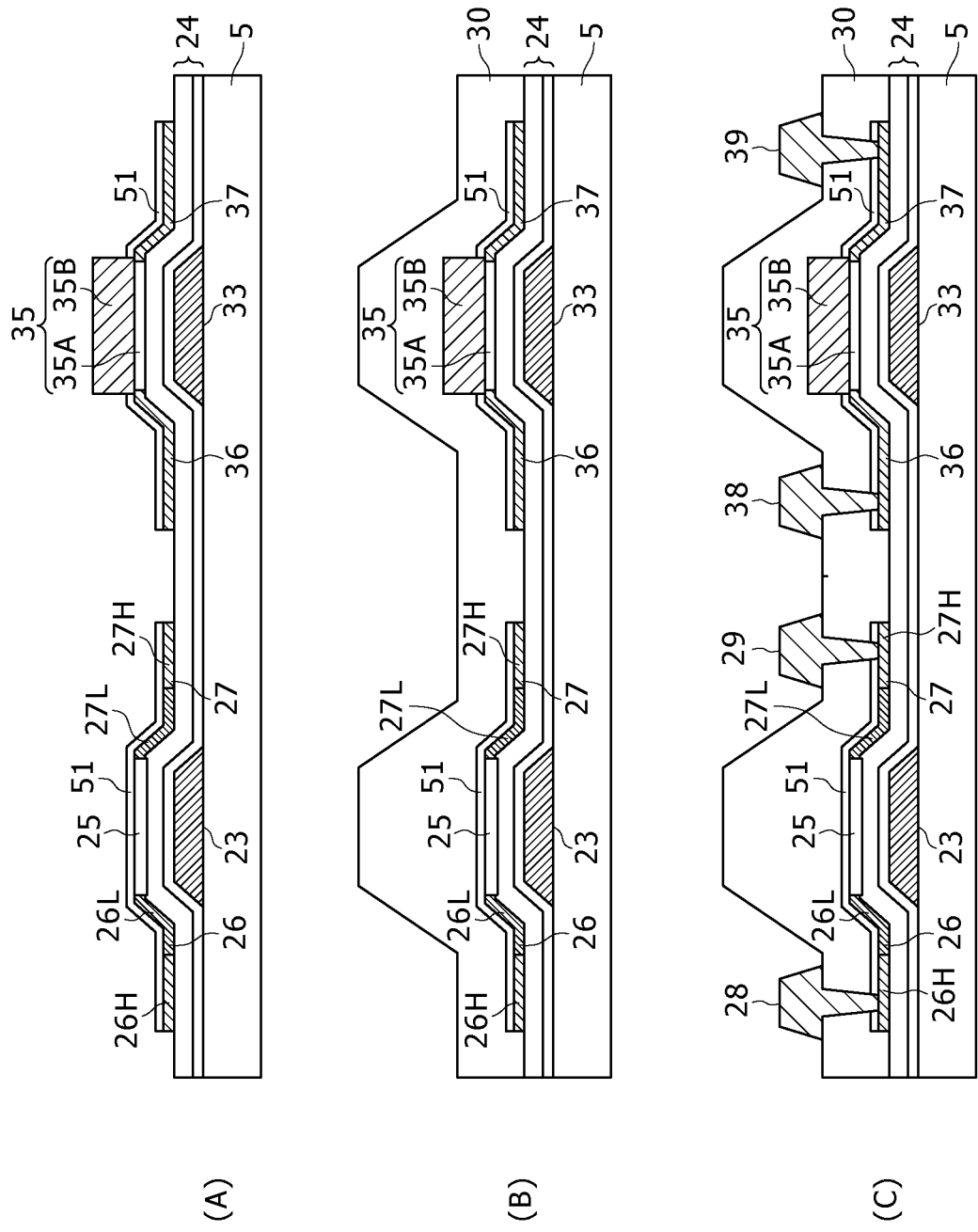
FIG. 26 shows views (No. 3) illustrating the method for manufacturing the liquid crystal display according to the sixth embodiment of the invention.

Next, as shown in (B) of FIG. 26, an inter-layer insulating film 30 is formed over the glass substrate 5 in the state of covering the channel layer 25, the source 26 and the drain 27 and also covering the photoelectric conversion layer 35, the source 36 and the drain 37.

Subsequently, as shown in (C) of FIG. 26, a contact hole reaching the high-concentration impurity region 26H of the source 26 and a contact hole reaching the high-concentration impurity region 27H of the drain 27 are formed respectively on both sides of the channel layer 25. Then, a source electrode 28 and a drain electrode 29 are formed in the inter-layer insulating film 30 in the state of filling up these contact holes with a wiring material. Besides, concurrently with this, a contact hole reaching the source 36 and a contact hole reaching the drain 37 are formed on both sides of the photoelectric conversion layer 35. Then, a source electrode 38 and a drain electrode 39 are formed in the state of filling up these contact holes with a wiring material.

By the manufacturing method as above, a driving substrate 2 configured as shown in FIG. 23 is obtained. Incidentally, while the source/drain 36, 37 in the second element forming portion 22 have been both $n^+$-type high-concentration impurity regions in the sixth embodiment described above, this configuration is not limitative, and a configuration may be adopted in which the source/drain 36, 37 are both $p^+$-type high-concentration impurity regions.

Seventh Embodiment

A seventh embodiment of the present invention differs from the above-described fourth embodiment, particularly in the method for manufacturing a liquid crystal display.

Figure 27:
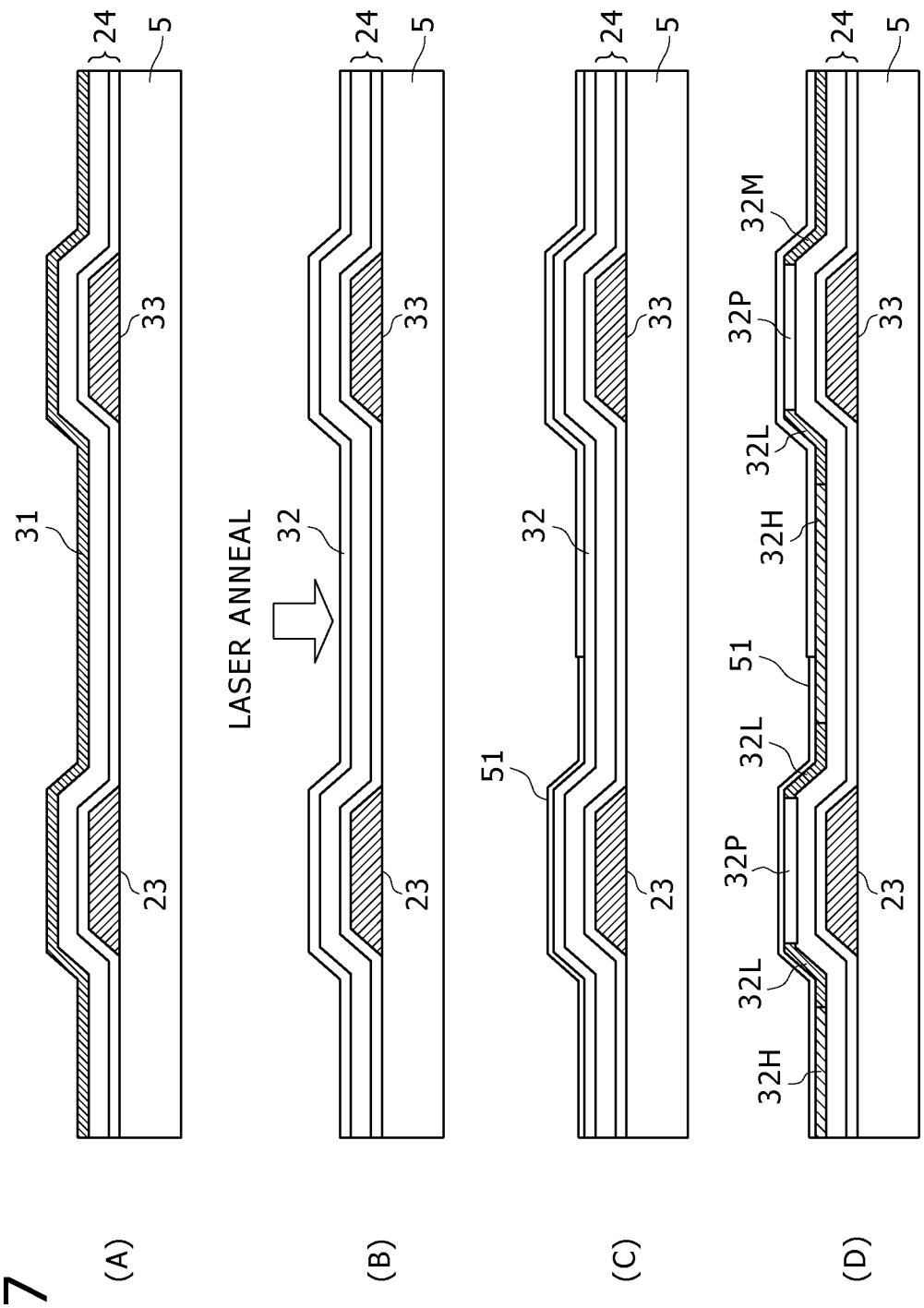
FIG. 27 shows views (No. 1) illustrating a method for manufacturing a liquid crystal display according to a seventh embodiment of the invention.
Figure 28:
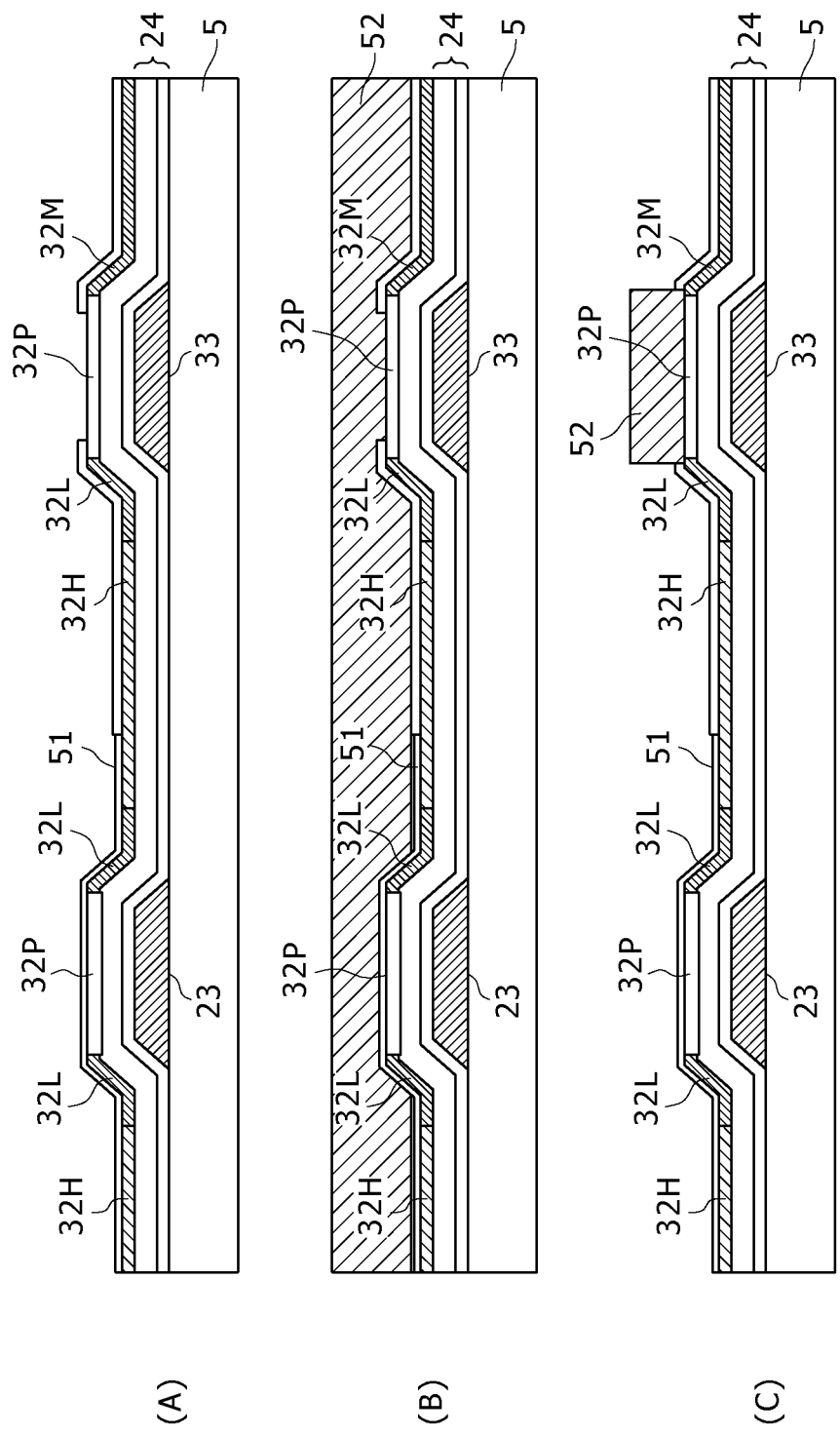
FIG. 28 shows views (No. 2) illustrating the method for manufacturing the liquid crystal display according to the seventh embodiment of the invention.
Figure 29:
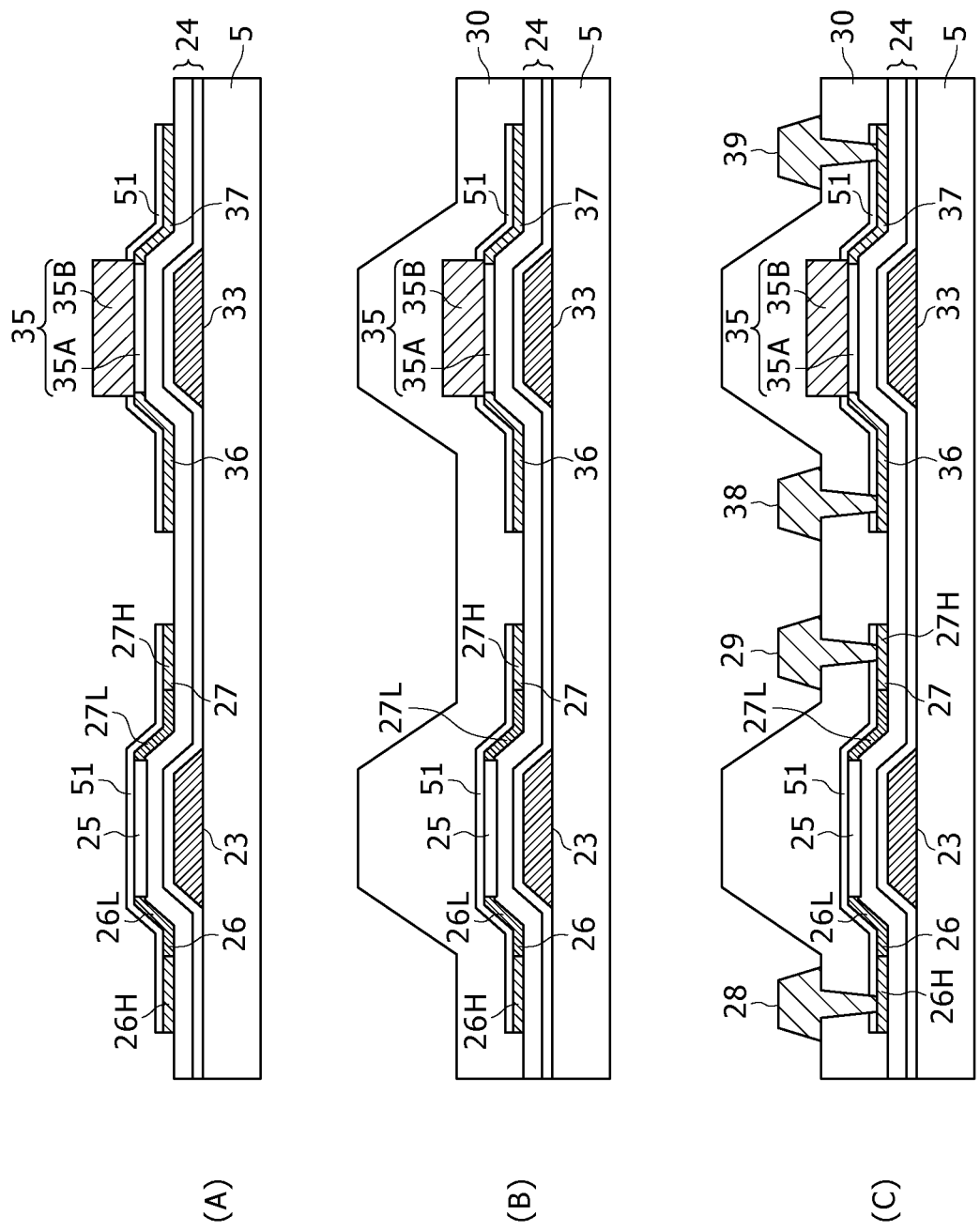
FIG. 29 shows views (No. 3) illustrating the method for manufacturing the liquid crystal display according to the seventh embodiment of the invention.

FIGS. 27 to 29 show views illustrating a method for manufacturing a liquid crystal display according to the seventh embodiment of the present invention. First, as shown in (A) of FIG. 27, gate electrodes 23, 33 and a gate insulating film 24 are formed over a glass substrate 5 to be provided with the above-mentioned plurality of pixels 11 in a matrix pattern, and thereafter a semiconductor film 31 of amorphous silicon is formed in the state of covering the gate insulating film 24. The semiconductor film 31 is formed over the glass substrate 5 so as to range over the first element forming portion 21 and the second element forming portion 22.

Next, as shown in (B) of FIG. 27, the amorphous semiconductor film 31 is polycrystallized by laser anneal, to obtain a semiconductor film 32 of polycrystalline silicon.

Subsequently, as shown in (C) of FIG. 27, a mask layer 51 is formed over the glass substrate 5 in the state of covering the semiconductor film 32. The steps up to this point are the same as in the case of the fourth embodiment above.

Next, as shown in (D) of FIG. 27, an impurity or impurities are introduced into the polycrystalline semiconductor film 32 respectively in a region on the upper side of the gate electrode 23, exclusive of a polycrystalline silicon portion for constituting a channel layer 25, and in a region on the upper side of the gate electrode 33, exclusive of a polycrystalline silicon portion for constituting a photoelectric conversion layer 35. The introduction of the impurity (impurities) is carried out by, for example, ion doping, ion implantation, plasma implantation or the like. By this, in the first element forming portion 21, the semiconductor film 32 is partitioned into a polycrystalline silicon region 32P, an $n^+$-type high-concentration impurity region 32H, and $n^+$-type low-concentration impurity regions 32L. Besides, in the second element forming portion 22, the semiconductor film 32 is partitioned into a polycrystalline silicon region 32P, an $n^+$-type high-concentration impurity region 32H, and a $p^+$-type high-concentration impurity region 32M.

Subsequently, as shown in (A) of FIG. 28, in the second element forming portion 22, the mask layer 51 is partially removed, to expose a surface (upper surface) of the polycrystalline silicon region 32P.

Next, as shown in (B) of FIG. 28, a semiconductor film 52 is formed over the glass substrate 5, inclusive of that part of the second element forming portion 22 at which the mask layer 51 has been removed, by use of the same element (in this embodiment, silicon element) as that used for forming the polycrystalline silicon region 32P. The formation of the semiconductor film 52 is carried out by, for example, a reactive CVD method, a plasma enhanced CVD method, a thermal CVD method or the like.

Subsequently, as shown in (C) of FIG. 28, the semiconductor film 52 covering the mask layer 51 is removed by etching in such a manner that the semiconductor film 52 is left only in that part of the second element forming portion 22 at which the mask layer 51 has been removed. In this instance, the mask layer 51 functions as an etching stopper.

Next, as shown in (A) of FIG. 29, in parts which correspond to the first element forming portion 21 and the second element forming portion 22, the semiconductor film 32 and the mask layer 51 covering it are separated into island-like shapes by wet etching or dry etching. By this, a channel layer 25 is formed in the first element forming portion 21, and a photoelectric conversion layer 35 is formed in the second element forming portion 22. Besides, a source 26 and a drain 27 are formed on the side of the gate electrode 23 included in the first element forming portion 21, and a source 36 and a drain 37 are formed on the side of the gate electrode 33 included in the second element forming portion 22. In this case, in the first element forming portion 21, the polycrystalline silicon region 32P forms the channel layer 25. In the second element forming portion 22, the polycrystalline silicon region 32P and the semiconductor film 52 respectively form a first layer 35A and a second layer 35B, and a stacked portion of them forms the photoelectric conversion layer 35. In addition, in the first element forming portion 21, the source 26 is partitioned into a high-concentration impurity region 26H and a low-concentration impurity region 26L of the $n^+$-type, and the drain 27 is similarly partitioned into a high-concentration impurity region 27H and a low-concentration impurity region 27L of the $n^+$-type. Besides, in the second element forming portion 22, the source 36 is partitioned into a high-concentration impurity region 36H and a low-concentration impurity region 36L of the $n^+$-type, and the drain 37 forms a high-concentration impurity region of the $p^+$-type.

Subsequently, as shown in (B) of FIG. 29, an inter-layer insulating film 30 is formed over the glass substrate 5 in the state of covering the channel layer 25, the source 26 and the drain 27 and also covering the photoelectric conversion layer 35, the source 36 and the drain 37.

Next, as shown in (C) of FIG. 29, a contact hole reaching the high-concentration impurity region 26H of the source 26 and a contact hole reaching the high-concentration impurity region 27H of the drain 27 are formed respectively on both sides of the channel layer 25. Then, a source electrode 28 and a drain electrode 29 are formed in the inter-layer insulating film 30 in the state of filling up these contact holes with a wiring material. Besides, concurrently with this, a contact hole reaching the high-concentration impurity region 36H of the source 36 and a contact hole reaching the drain 37 are formed respectively on both sides of the photoelectric conversion layer 35. Then, a source electrode 38 and a drain electrode 39 are formed in the state of filling up these contact holes with a wiring material.

By the manufacturing method as above, a driving substrate 2 having the same device structure as in the fourth embodiment above is obtained. In such a method for manufacturing a liquid crystal display, the technique for forming the photoelectric conversion layer 35 in the second element forming portion 22 is applicable not only to the above-described fourth embodiment but also to the above-described fifth embodiment and the above-described sixth embodiment, in the same manner.

Incidentally, in each of above described embodiments, a bottom gate type thin film transistor is took as an example, however, a top gate type may also be adopted as a structure of thin film transistor.

In addition, while the light sensor element is configured to have a structure similar to that of the thin film transistor including the channel layer in each of the above-described embodiments, other configurations may also be adopted; for example, the light sensor element may be formed by a photodiode of the pn junction type or the pin junction type. In a photodiode of the pin junction type, photoelectric conversion is performed in an i-layer between a p-layer and an n-layer, and, therefore, the i-layer corresponds to the "second active layer." On the other hand, in a photodiode of the pn junction type, photoelectric conversion is performed in the vicinity of the pn junction portion, and, therefore, an n-layer stacked on a p-layer in the substrate thickness direction or a p-layer stacked on an n-layer in the substrate thickness direction corresponds to the "second active layer."

Application Examples

The liquid crystal display 1 configured as above is applicable to electronic apparatuses in any field which are operable to display a picture signal inputted to the electronic apparatus or a picture signal produced in the electronic apparatus as an image or picture, such as the various electronic apparatuses shown in FIGS. 30 to 34, for example, digital cameras, notebook-sized personal computers, portable terminal devices such as mobile phones, etc., video cameras and so on.

Figure 30:
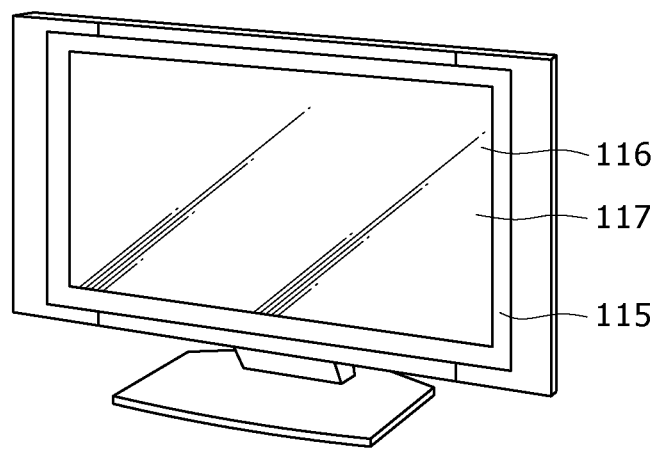
FIG. 30 is a perspective view of a television set which is a first application example of the invention.

FIG. 30 is a perspective view of a television set as a first application example. The television set according to this application example includes a picture display screen unit 117 composed of a front panel 115, a filter glass 116 and the like, and the liquid crystal display 1 is applicable to the picture display screen unit 117.

Figure 31:
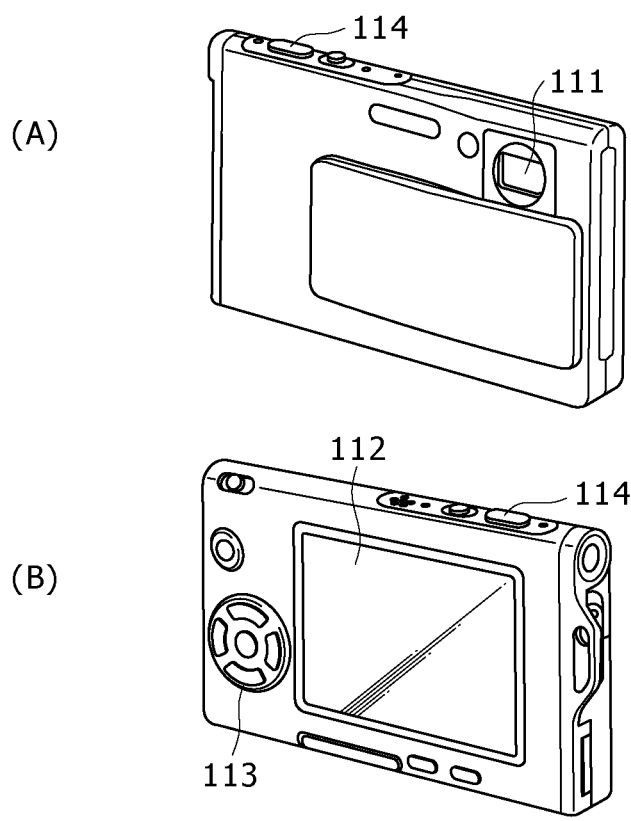
FIG. 31 shows views of a digital camera which is a second application example of the invention.

FIG. 31 illustrates a digital camera as a second application example, in which (A) is a perspective view as viewed from the front side, and (B) is a perspective view as viewed from the back side. The digital camera according to this application example includes a flash light emission unit 111, a display unit 112, a menu switch 113, a shutter button 114 and the like, and the liquid crystal display 1 is applicable to the display unit 112.

Figure 32:
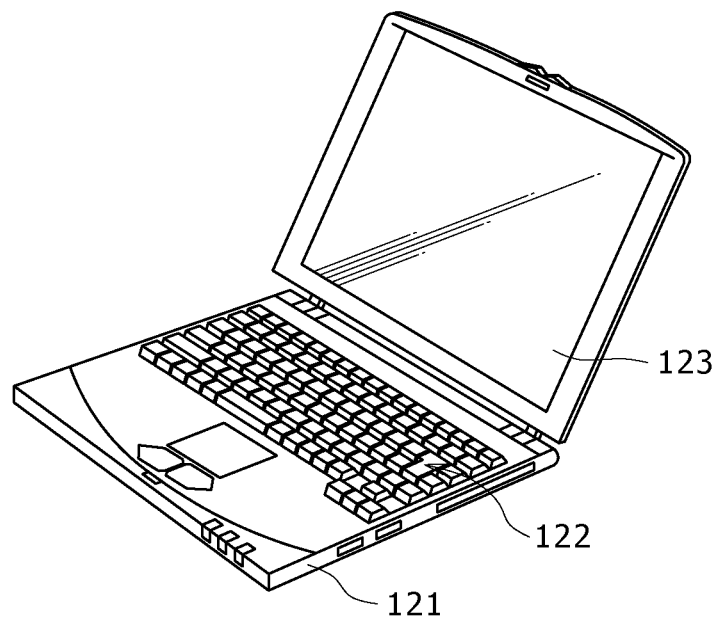
FIG. 32 is a perspective view of a notebook-sized personal computer which is a third application example of the invention.

FIG. 32 is a perspective view of a notebook-sized personal computer as a third application example. The notebook-sized personal computer according to this application example includes a main body 121 equipped with a keyboard 122 operated at the time of inputting characters or the like, a display unit 123 for displaying images, etc., and the liquid crystal display 1 is applicable to the display unit 123.

Figure 33:
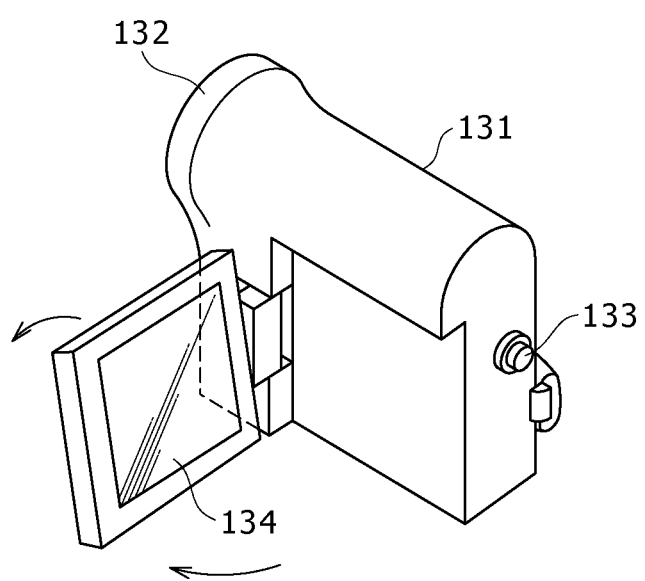
FIG. 33 is a perspective view of a video camera which is a fourth application example of the invention.
Figure 35:
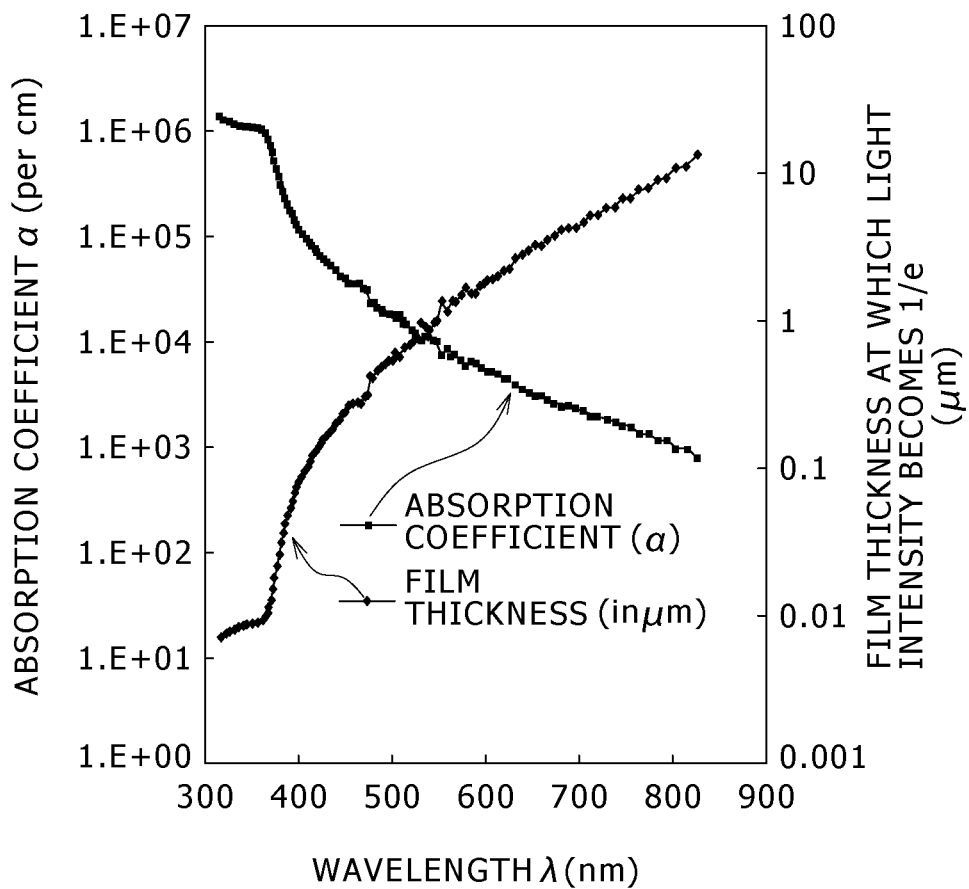
FIG. 35 is a graph plotted with light wavelength ($\lambda$) taken on the axis of abscissas, absorption coefficient ($\alpha$) taken on the left axis of ordinates, and film thickness at which light intensity becomes 1/e taken on the right axis of ordinates, in the case where poly-Si is used to form the channel layer and the photoelectric conversion layer in the present invention.
Figure 36:
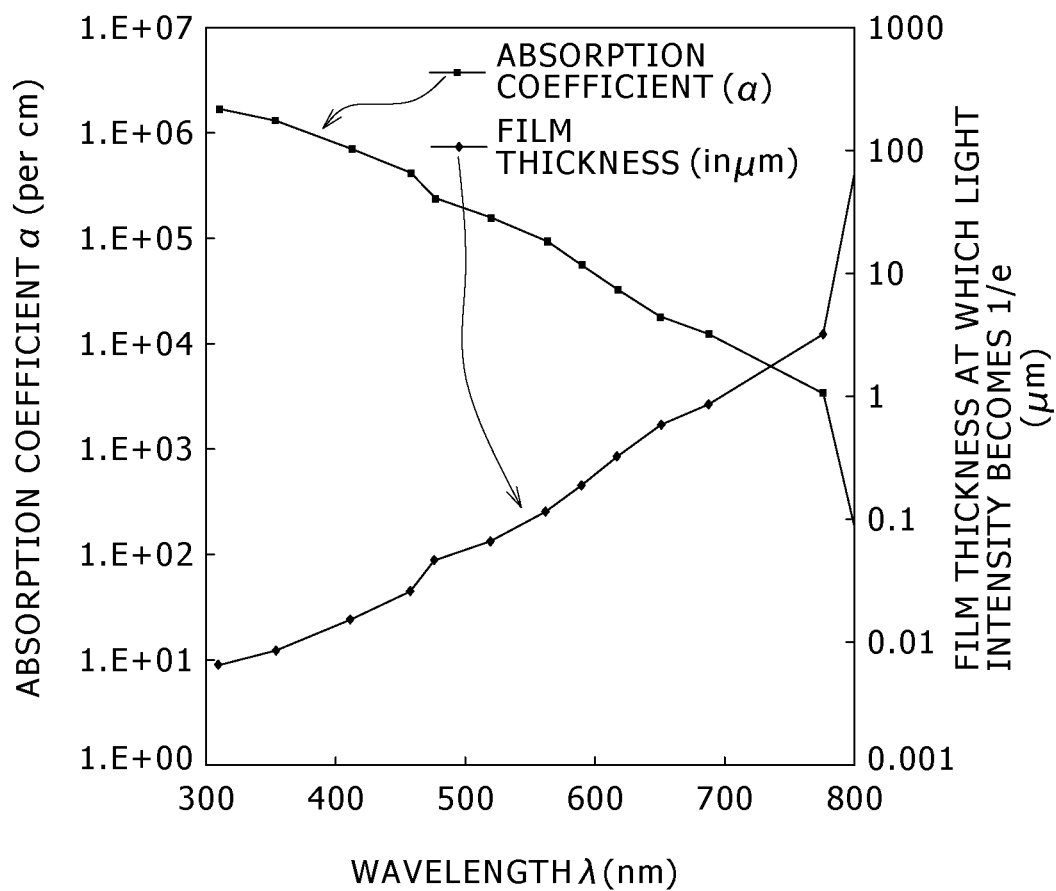
FIG. 36 is a graph plotted with light wavelength ($\lambda$) taken on the axis of abscissas, absorption coefficient ($\alpha$) taken on the left axis of ordinates, and film thickness at which light intensity becomes 1/e taken on the right axis of ordinates, in the case where a-Si:H is used to form the channel layer and the photoelectric conversion layer.

FIG. 33 is a perspective view of a video camera as a fourth application example. The video camera according to this application example includes a body part 131, a lens 132 for shooting an object, provided at a side face oriented forwards, a start/stop switch 133 operated at the time of shooting, a display unit 134, etc., and the liquid crystal display 1 is applicable to the display unit 134.

FIG. 34 illustrates a portable terminal device, for example, a mobile phone as a fifth application example, in which (A) is a front view of the mobile phone in an opened state, (B) is a side view of the same, (C) is a front view of the same in a closed state, (D) is a left side view, (E) is a right side view, (F) is a top view, and (G) is a bottom view. The mobile phone according to this application example includes an upper casing 141, a lower casing 142, a link part (here, a hinge part) 143, a display 144, a sub-display 145, a picture light 146, a camera 147, etc., and the liquid crystal display 1 is applicable to the display 144 and the sub-display 145.

The invention claimed is:

1. A display comprising:
   a substrate comprising a plurality of pixels arranged in a matrix pattern;
   a gate insulating layer over said substrate;
   a first active layer including switching elements for said pixels formed therefrom, said first active material layer having at least a portion removed therefrom;
   a second active layer including light sensor elements formed therefrom, said second active layer in the removed portion of said first active layer; and
   said active layers being over said gate insulating layer of said substrate,
   wherein,
      said second active layer has a light absorption coefficient higher than said first active layer, and
      said first active layer includes a channel layer.

2. The display according to claim 1 wherein said second active layer is thicker than said first active layer.

3. The display according to claim 1 or 2, wherein said second active layer being a material different from the material for said first active layer.

4. The display according to claim 2, wherein said second active layer has a stacked structure including a first layer having the same thickness as the thickness of said first active layer, and a second layer stacked on said first layer.

5. The display according to claim 4, wherein said second layer is formed by use of the same element as the element used for forming said first layer.

6. The display according to claim 1, wherein:
   said substrate has a display area in which said plurality of pixels are arranged and a peripheral area adjacent to said display area;
   said first active layer is arranged in at least said display area
   said second active layer is arranged in at least one of said display area and said peripheral area.

7. The display according to claim 1, wherein said substrate has a display area in which said plurality of pixels are arranged, and a peripheral area adjacent to said display area;
   said first active layer is formed by a transparent semiconductor film and is arranged in said display area; and said second active layer is formed by an opaque semiconductor film and is arranged in said peripheral area.

8. The display according to claim 1, wherein a light reflecting film is formed on a surface of an electrode arranged closest to and opposite to said second active layer on the side opposite to the side of incidence of external light.

9. A method for manufacturing a display, the method comprising the steps of:
provide a substrate with a gate insulating layer over the substrate, the gate insulating layer including a plurality of pixels in a matrix pattern;
forming a first active layer including switching elements for a plurality of pixels formed therefrom, said first active layer located over the gate insulating layer;
removing a portion of said first active layer; and
forming a second active layer including light sensor elements formed therefrom, said second active layer in place of the removed portion of said first active layer
wherein,
the second active layer has a light absorption coefficient that is higher than that of said first active layer and
said first active layer includes a channel layer.

10. The method for manufacturing the display according to claim 9, wherein said second active layer is thicker than said first active layer.

11. The method for manufacturing the display according to claim 9, wherein said second active layer being of a material different than the material of said first active layer.

12. The method for manufacturing the display according to claim 10, comprising the steps of:
forming a first layer having the same thickness as the thickness of said first active layer, together with said first active layer; and
stacking said first layer and a second layer stacked on said first layer to thereby form said second active layer.

13. A method for manufacturing a display, the method comprising the step of:
providing a substrate with a gate insulating layer over the substrate, the gate insulating layer including a plurality of pixels in a matrix pattern;
forming a first active layer including switching elements for a plurality of pixels formed therefrom over the gate insulating layer;
removing a portion of said first active layer; and
forming a second active layer including light sensor elements formed therefrom over the gate insulating layer and in place of the removed portion of said first active layer,
wherein,
the second active layer has a different thickness than said first active layer or a different material than said first active layer, and
said first active layer includes a channel layer.

14. A method for manufacturing a display, the method comprising the steps of:
providing a substrate;
forming a semiconductor film over a first element forming portion and a second element forming portion located on the substrate, and thereafter introducing an impurity into said semiconductor film;
separating said semiconductor film into island-like shapes in said first element forming portion and said second element forming portion to form a first active layer in said first element forming portion with said semiconductor film;
removing a portion of said semiconductor film located in a part of said second element forming portion which corresponds to a first active layer; and
forming a second active layer in place of the portion of said semiconductor film removed from said second element forming portion;
wherein,
said first active layer includes a switching element, and
said second active layer includes a light sensor element.

15. The method for manufacturing the display according to claim 14, wherein said second active layer is formed by a selective film forming process for selectively forming a film in at least that part of said second element forming portion at which said semiconductor film has been removed.

* * * * *